(12) United States Patent
Machida

(10) Patent No.: US 11,719,490 B2
(45) Date of Patent: Aug. 8, 2023

(54) LOOP HEAT PIPE WITH RECESSED OUTER WALL SURFACE

(71) Applicant: SHINKO ELECTRIC INDUSTRIES CO., LTD., Nagano (JP)

(72) Inventor: Yoshihiro Machida, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 335 days.

(21) Appl. No.: 17/030,930

(22) Filed: Sep. 24, 2020

(65) Prior Publication Data

US 2021/0131742 A1    May 6, 2021

(30) Foreign Application Priority Data

Oct. 31, 2019  (JP) .................................. 2019-198357

(51) Int. Cl.
F28D 15/00    (2006.01)
F28D 15/02    (2006.01)

(52) U.S. Cl.
CPC ................................ F28D 15/0266 (2013.01)

(58) Field of Classification Search
CPC ...... F28D 15/0266; F28D 15/043; F28F 3/04; F28F 1/16
See application file for complete search history.

(56) References Cited

U.S. PATENT DOCUMENTS

| 5,381,859 A  * | 1/1995 | Minakami ........... F28D 15/0275 174/16.3 |
| 6,648,067 B1 * | 11/2003 | Maute .................. F28D 9/0037 165/905 |
| 6,959,492 B1 * | 11/2005 | Matsumoto ........... F28D 9/0075 29/890.039 |
| 2002/0093255 A1 | 7/2002 | Matsumoto |
| 2006/0105213 A1* | 5/2006 | Otsuka .................. H01M 8/242 429/468 |
| 2006/0164809 A1* | 7/2006 | Yu ........................ H01L 23/467 257/E23.099 |
| 2016/0259383 A1* | 9/2016 | Shioga ................ F28D 15/0266 |
| 2018/0058767 A1* | 3/2018 | Machida ............. H01L 21/4882 |
| 2019/0090385 A1 | 3/2019 | Machida et al. |

(Continued)

FOREIGN PATENT DOCUMENTS

| JP | 2002-218703 | 8/2002 |
| JP | 2004-273140 | 9/2004 |

(Continued)

OTHER PUBLICATIONS

Extended European Search Report dated Feb. 18, 2021 issued with respect to the corresponding European Patent Application No. 20201828.9.

(Continued)

*Primary Examiner* — Travis Ruby
(74) *Attorney, Agent, or Firm* — IPUSA, PLLC

(57) ABSTRACT

A loop heat pipe includes an evaporator to vaporizes a working fluid, a condenser to liquefy the working fluid, a liquid pipe to connect the evaporator and the condenser, and a vapor pipe to connect the evaporator and the condenser, and form a loop-shaped passage together with the liquid pipe. A recess is formed in at least a portion of an outer wall surface of a pipe wall of the evaporator, the condenser, the liquid pipe, and the vapor pipe.

20 Claims, 24 Drawing Sheets

(56) References Cited

U.S. PATENT DOCUMENTS

| 2019/0128620 A1 | 5/2019 | Machida |
| 2019/0242652 A1 | 8/2019 | Machida |
| 2019/0285354 A1 | 9/2019 | Machida |

FOREIGN PATENT DOCUMENTS

| JP | 2014-031579 | 2/2014 |
| JP | 2015-094490 | 5/2015 |
| JP | 2019-082309 | 5/2019 |
| JP | 2019-135434 | 8/2019 |

OTHER PUBLICATIONS

Office Action dated Apr. 4, 2023 with respect to the corresponding Japanese patent application No. 2019-198357.

* cited by examiner

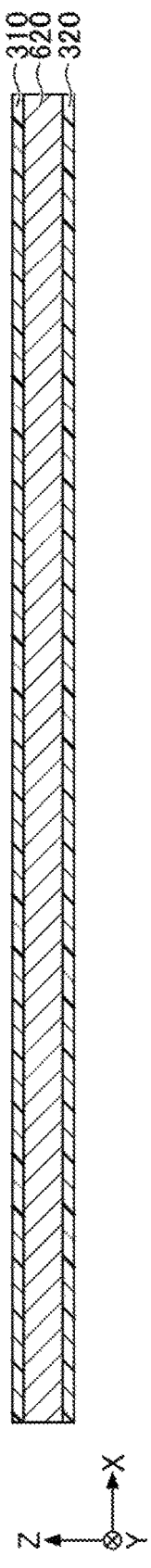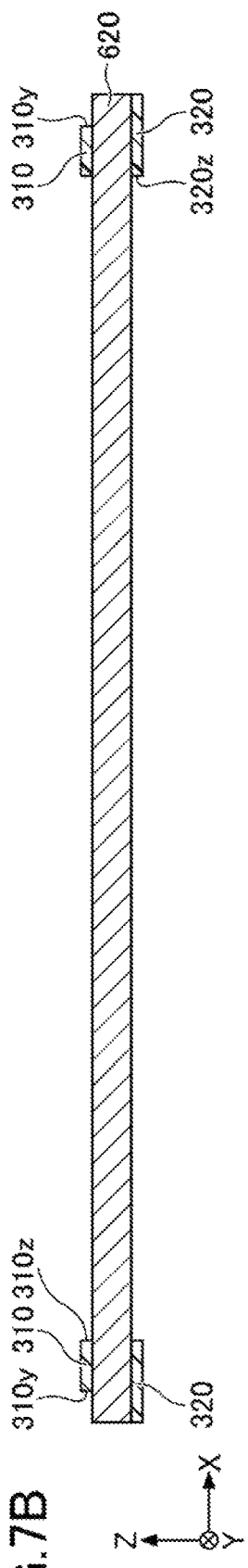

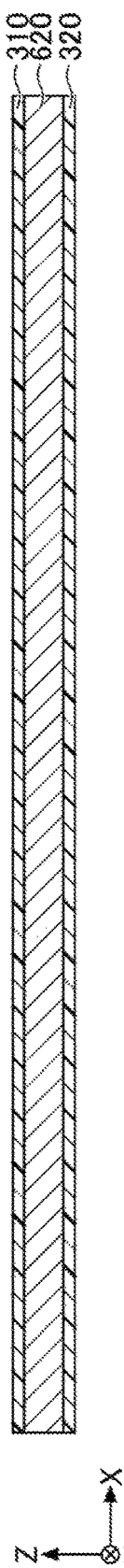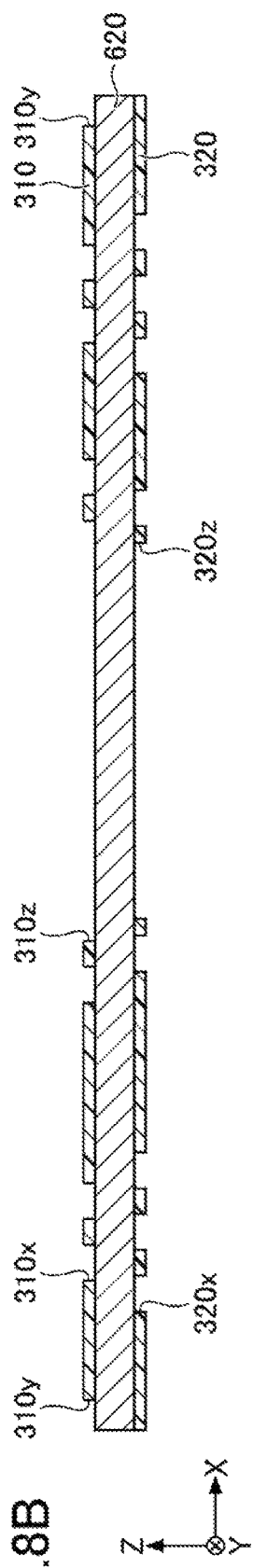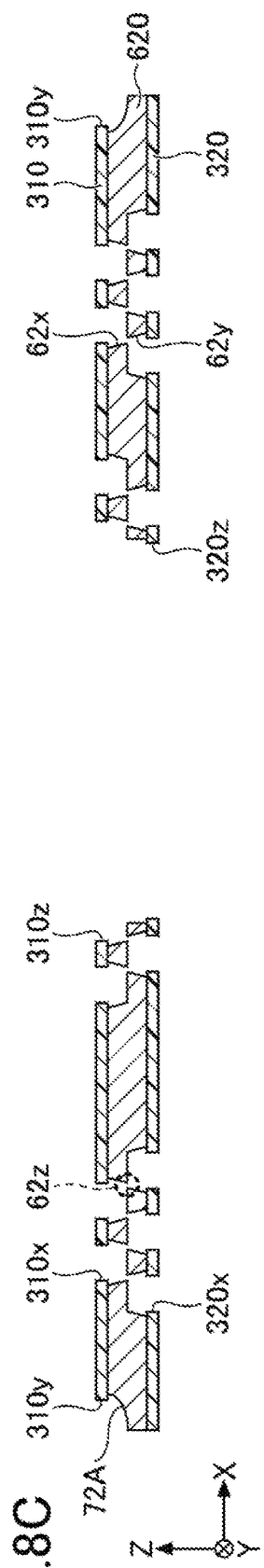

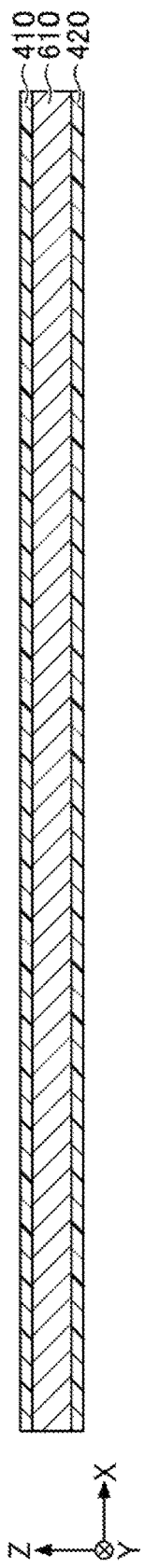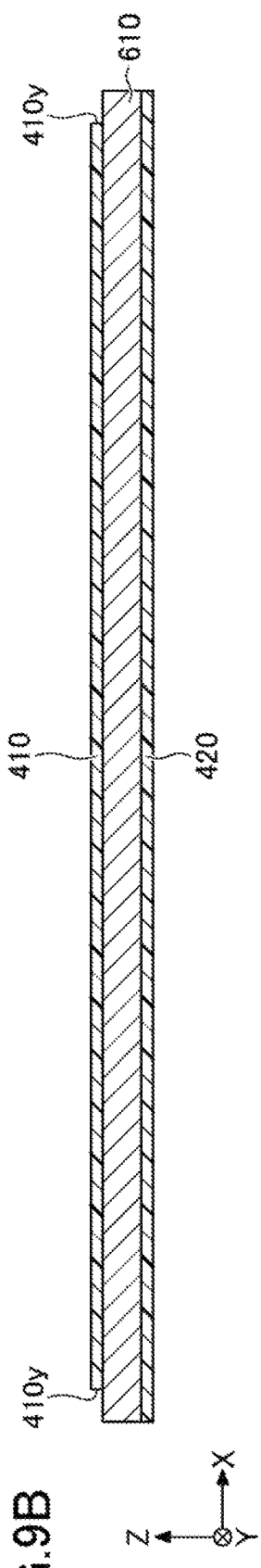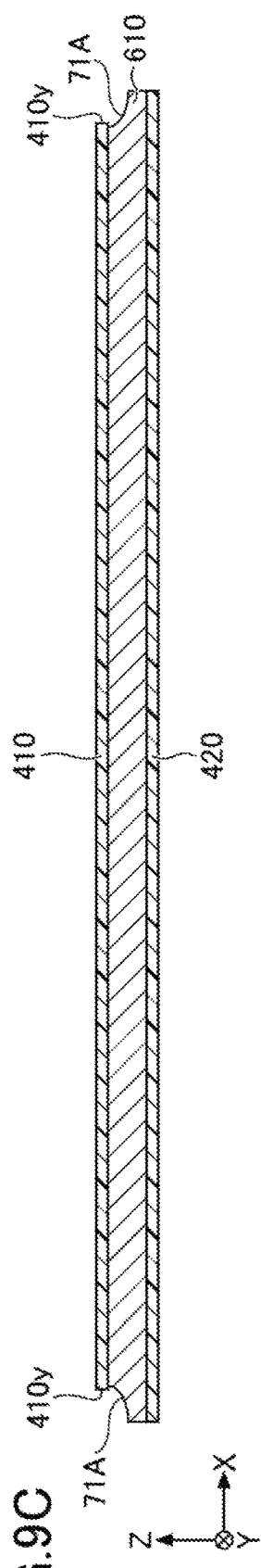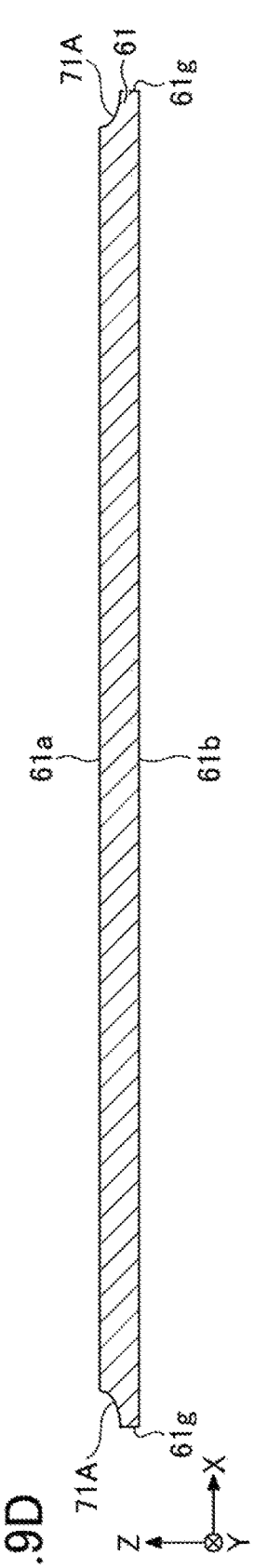

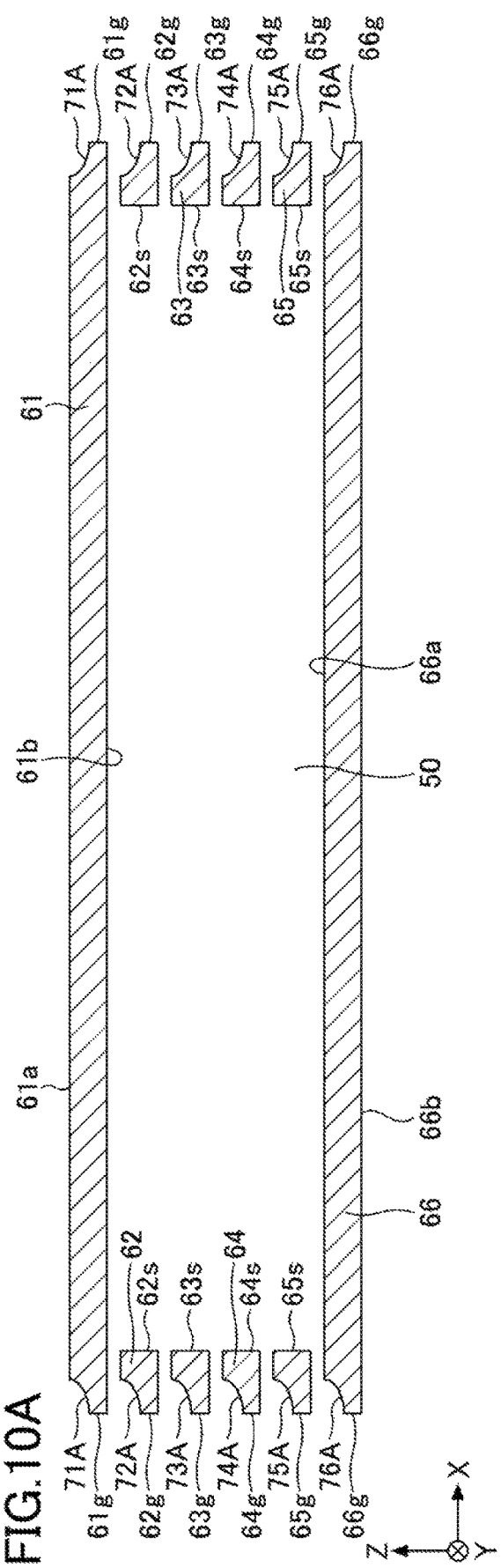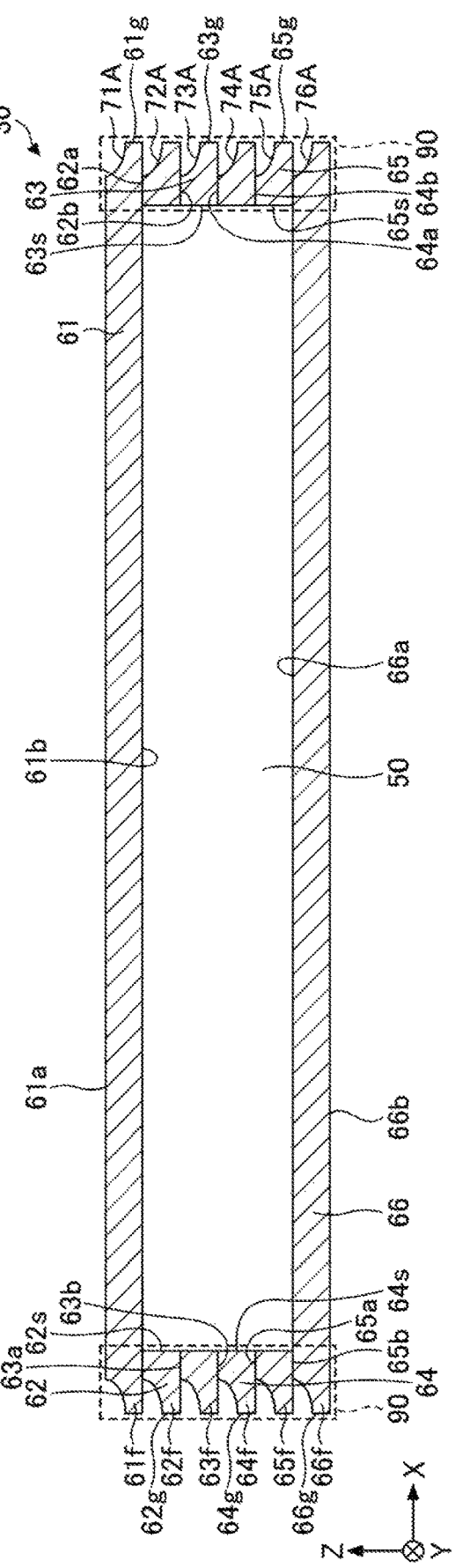

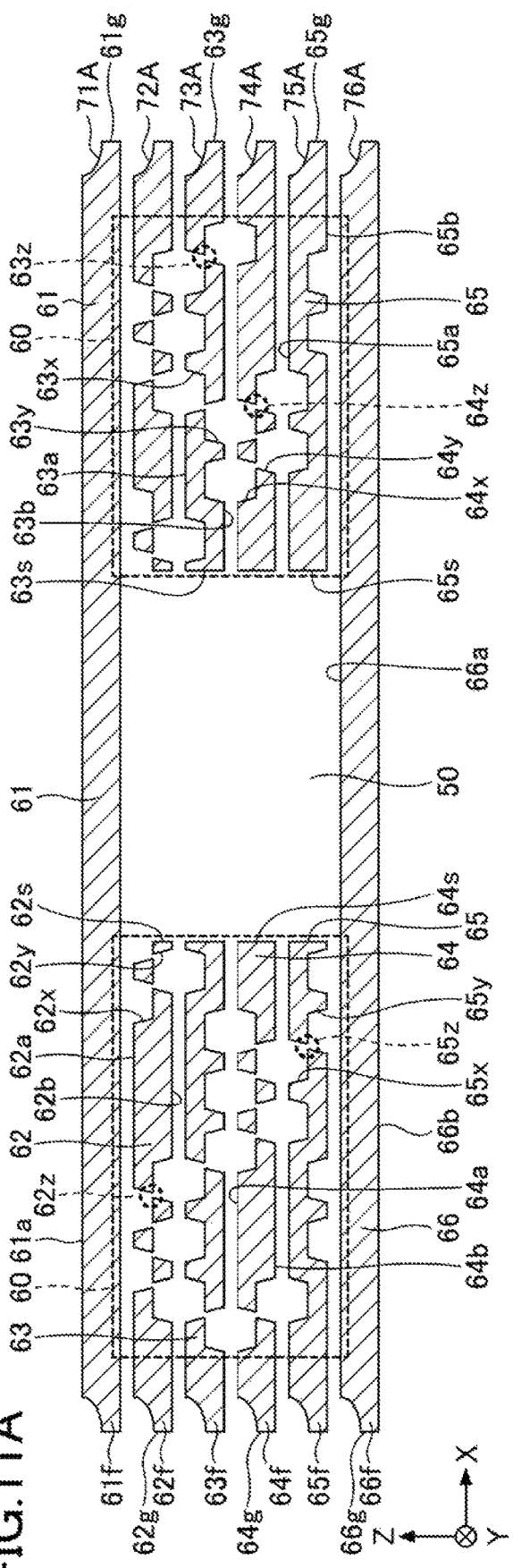
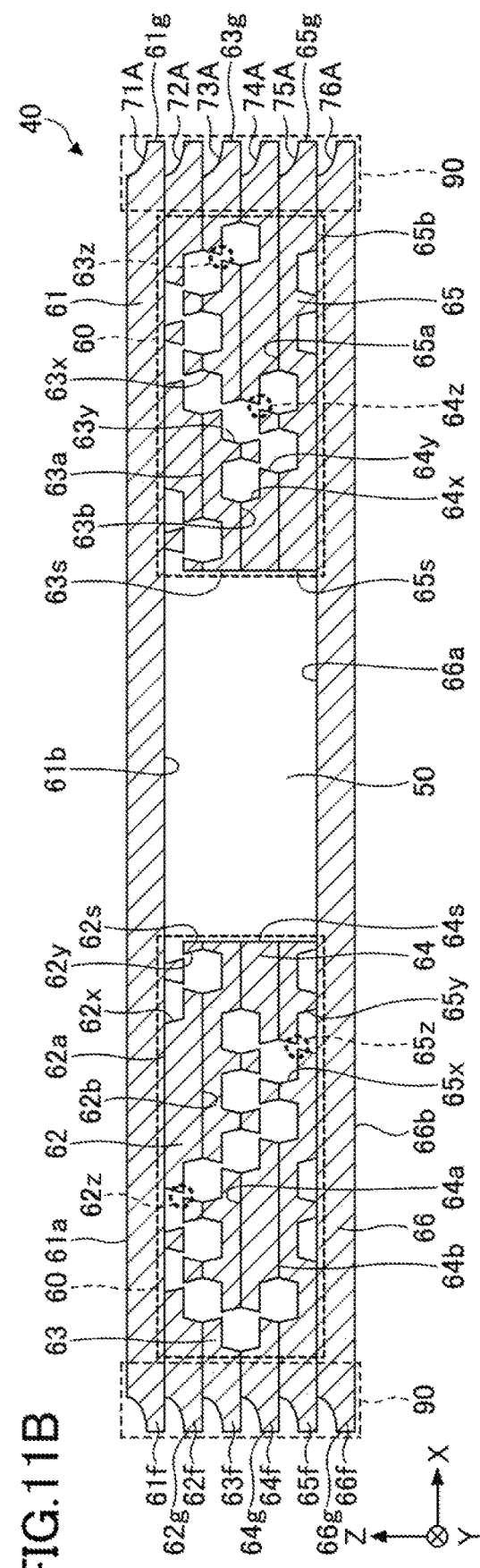

LOOP HEAT PIPE WITH RECESSED OUTER WALL SURFACE

CROSS-REFERENCE TO RELATED APPLICATION

This application is based upon and claims priority to Japanese Patent Application No. 2019-198357, filed on Oct. 31, 2019, the entire contents of which are incorporated herein by reference.

FIELD

Certain aspects of the embodiments discussed herein are related to a loop heat pipe, and a method for manufacturing the loop heat pipe.

BACKGROUND

The heat pipe is known as a device for cooling a heat-generating component, such as a Central Processing Unit (CPU) or the like, provided in electronic devices. The heat pipe utilizes a phase change of a working fluid to transfer heat.

A loop heat pipe is an example of the heat pipe, and includes an evaporator that vaporizes the working fluid by the heat of the heat-generating component, and a condenser that liquefies the vaporized working fluid. The evaporator and the condenser are connected by a loop-shaped passage that is formed by a liquid pipe and a vapor pipe. In the loop heat pipe, the working fluid flows through the loop-shaped passage in one direction.

In addition, a porous body is provided inside the evaporator and the liquid pipe of the loop heat pipe, and the working fluid inside the liquid pipe is guided to the evaporator due to a capillary force generated in the porous body, to restrict the backflow of vapor from the evaporator to the liquid pipe. A large number of pores are formed in the porous body. Each pore is formed by partially communicating a bottomed hole formed in one side of a metal layer, and a bottomed hole formed in the other side of the metal layer, as described in Japanese Laid-Open Patent Publication No. 2019-135434 (now Japanese Patent No. 6400240), for example.

Other heat pipes are described in Japanese Laid-Open Patent Publication No. 2015-094490 (now Japanese Patent No. 6311278), for example.

However, the conventional loop heat pipes may not be able to provide sufficiently high heat dissipation performance.

SUMMARY

Accordingly, it is an object in one aspect of the embodiments to provide a loop heat pipe capable of improving the heat dissipation performance, and a method for manufacturing the loop heat pipe.

According to one aspect of the embodiments, a loop heat pipe includes an evaporator configured to vaporizes a working fluid; a condenser configured to liquefy the working fluid; a liquid pipe configured to connect the evaporator and the condenser; and a vapor pipe configured to connect the evaporator and the condenser, and forms a loop-shaped passage together with the liquid pipe, wherein a recess is formed in at least a portion of an outer wall surface of a pipe wall of the evaporator, the condenser, the liquid pipe, and the vapor pipe.

According to another aspect of the embodiments, a method of manufacturing a loop heat pipe includes forming an evaporator configured to vaporizes a working fluid, a condenser configured to liquefy the working fluid, a liquid pipe configured to connect the evaporator and the condenser, and a vapor pipe configured to connect the evaporator and the condenser, and forms a loop-shaped passage together with the liquid pipe, wherein the forming includes forming a recess in at least a portion of an outer wall surface of a pipe wall of the evaporator, the condenser, the liquid pipe, and the vapor pipe.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIG. 7A, FIG. 7B, FIG. 7C, and FIG. 7D are diagrams (part 1) illustrating an example of manufacturing processes of the loop heat pipe according to the first embodiment.

FIG. 8A, FIG. 8B, FIG. 8C, and FIG. 8D are diagrams (part 2) illustrating the example of the manufacturing processes of the loop heat pipe according to the first embodiment.

FIG. 9A, FIG. 9B, FIG. 9C, and FIG. 9D are diagrams (part 3) illustrating the example of the manufacturing processes of the loop heat pipe according to the first embodiment.

FIG. 10A and FIG. 10B are diagrams (part 4) illustrating the example of the manufacturing processes of the loop heat pipe according to the first embodiment.

FIG. 11A and FIG. 11B are diagrams (part 5) illustrating the example of the manufacturing processes of the loop heat pipe according to the first embodiment.

DESCRIPTION OF EMBODIMENTS

Figure 1:
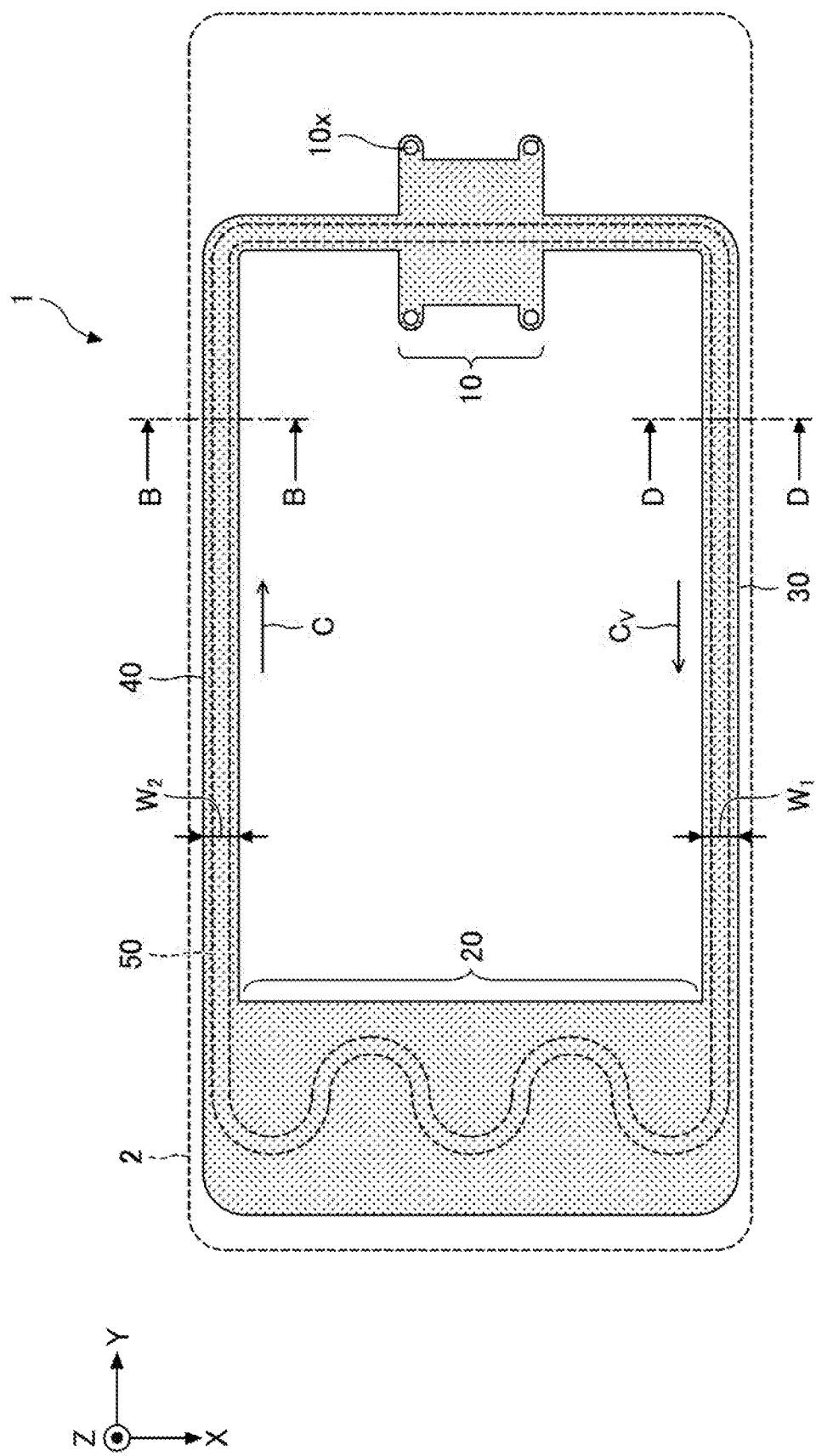
FIG. 1 is a plan view schematically illustrating an example of a loop heat pipe according to a first embodiment.

Preferred embodiments of the present invention will be described with reference to the accompanying drawings. In the drawings, those parts that are the same are designated by the same reference numerals, and a repeated description of the same parts may be omitted.

A description will now be given of embodiments of a loop heat pipe and a method for manufacturing the loop heat pipe according to the present invention.

First Embodiment

[Structure of Loop Heat Pipe According to First Embodiment]

First, a structure of the loop heat pipe according to a first embodiment will be described. FIG. 1 is a plan view schematically illustrating an example of the loop heat pipe according to the first embodiment.

As illustrated in FIG. 1, a loop heat pipe 1 includes an evaporator 10, a condenser 20, a vapor pipe 30, and a liquid pipe 40. The loop heat pipe 1 may be accommodated in a mobile electronic device 2, such as a smartphone, a tablet terminal, or the like, for example.

In the loop heat pipe 1, the evaporator 10 has a function to vaporize a working fluid C to generate vapor Cv. The condenser 20 has a function to liquefy the vapor Cv of the working fluid C. The evaporator 10 and the condenser 20 are connected via the vapor pipe 30 and the liquid pipe 40, and the vapor pipe 30 and the liquid pipe 40 form a loop-shaped passage (or fluid channel) 50 in which the working fluid C or the vapor Cv flows.

Figure 2:
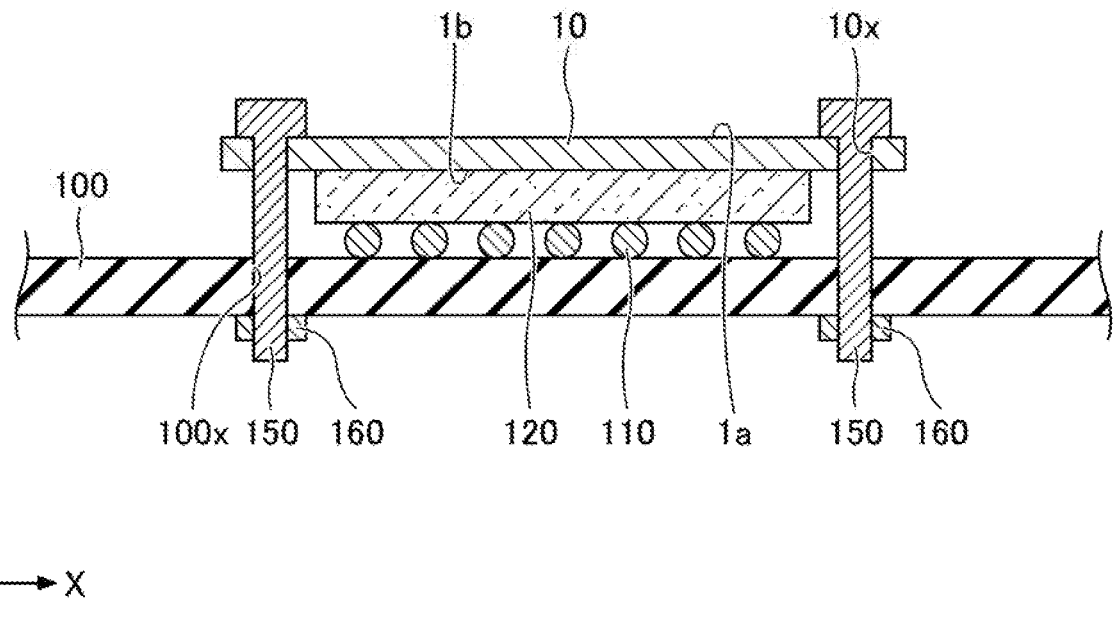
FIG. 2 is a cross sectional view of an evaporator and its periphery of the loop heat pipe according to the first embodiment.

FIG. 2 is a cross sectional view of the evaporator and its periphery of the loop heat pipe and its periphery of the loop heat pipe according to the first embodiment. As illustrated in FIG. 1 and FIG. 2, four through-holes 10x are formed in the evaporator 10, for example. The evaporator 10 and a circuit board 100 may be fixed to each other, by inserting each bolt 150 through each through-hole 10x formed in the evaporator 10, and each through-hole 100x formed in the circuit board 100, and securing each bolt 150 by a nut 160 from a lower surface of the circuit board 100. The evaporator 10, the condenser 20, the vapor pipe 30, and the liquid pipe 40 have an upper surface 1a, and a lower surface 1b on an opposite side from the upper surface 1a. In the present disclosure, a plan view refers to a view that is viewed from above in a direction perpendicular to the upper surface 1a.

For example, a heat-generating component 120, such as a CPU or the like, is mounted on the circuit board 100 via bumps 110, and an upper surface of the heat-generating component 120 makes direct contact with the lower surface 1b of the evaporator 10. The working fluid C inside the evaporator 10 is vaporized by the heat generated by the heat-generating component 120, to generate the vapor Cv.

As illustrated in FIG. 1, the vapor Cv generated by the evaporator 10 is guided to the condenser 20 through the vapor pipe 30, and liquefied in the condenser 20. Hence, the heat generated by the heat-generating component 120 is transferred to the condenser 20, thereby reducing a temperature rise of the heat-generating component 120. The working fluid C liquefied by the condenser 20 is guided to the evaporator 10 through the liquid pipe 40. A width $W_1$ of the vapor pipe 30 may be approximately 8 mm, for example. In addition, a width $W_2$ of the liquid pipe 40 may be approximately 6 mm, for example.

The type of the working fluid C is not particularly limited, but in order to efficiently cool the heat-generating component 120 by the latent heat of vaporization, it is preferable to use a fluid having a high vapor pressure and a large latent heat of vaporization. Examples of such a fluid include ammonia, water, fluorocarbon, alcohol, and acetone, for example.

The evaporator 10, the condenser 20, the vapor pipe 30, and the liquid pipe 40 may be formed by a structure in which a plurality of metal layers are laminated. The metal layers are copper layers having a high thermal conductivity, for example, and the metal layers are directly bonded to each other by solid-phase (or solid-state) bonding or the like. Each of the metal layers may have a thickness of approximately 50 µm to approximately 200 µm, for example.

Of course, the metal layers of the loop heat pipe 1 are not limited to the copper layers, and may be stainless steel layers, aluminum layers, magnesium alloy layers, or the like, for example. In addition, the number of metal layers that are laminated is not limited to a particular number.

Figure 3:
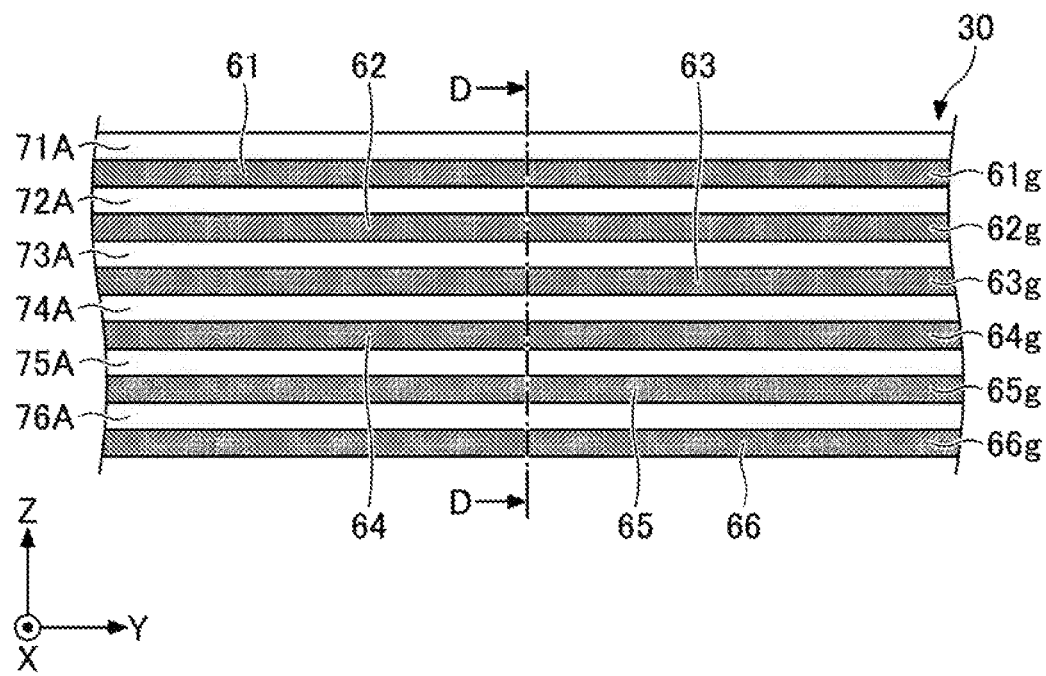
FIG. 3 is a side view illustrating an example of a vapor pipe according to the first embodiment.
Figure 4:
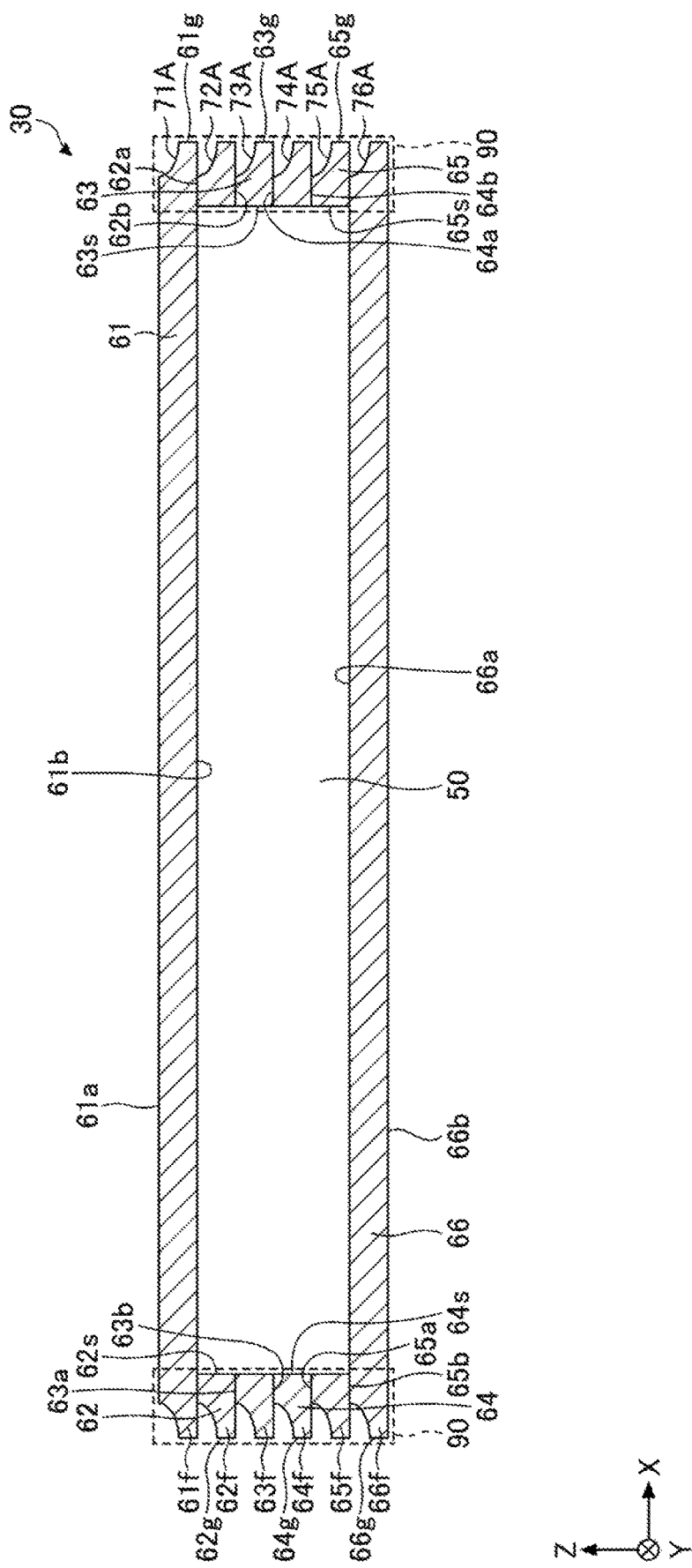
FIG. 4 is a cross sectional view illustrating the example of the vapor pipe according to the first embodiment.

The structure of the vapor pipe 30 will now be described. FIG. 3 and FIG. 4 illustrate an example of the vapor pipe according to the first embodiment. FIG. 3 is a side view viewed from an X-direction, and FIG. 4 is a cross sectional view along a line D-D in FIG. 1 and FIG. 3.

As illustrated in FIG. 4, the vapor pipe 30 includes the passage 50 through which the vapor Cv of the working fluid C flows. The passage 50 may have a structure that is closed by a lower surface 61b of a first metal layer (one outermost metal layer) 61, an upper surface 66a of a sixth metal layer (the other outermost metal layer) 66, and inner wall surfaces 62s through 65s of metal layers 62 through 65. A region where the six metal layers 61 through 66 are laminated, at both ends of the metal layers 61 through 66 along the X-direction, will be referred to as a pipe wall 90.

In FIG. 3 and FIG. 4, a laminating direction of the metal layers 61 through 66 is a Z-direction, an arbitrary direction within a plane perpendicular to the Z-direction is the X-direction, and a direction within this plane and perpendicular to the X-direction is a Y-direction. The same definitions of the directions apply to other figures.

In the two pipe walls 90, the metal layer 61 includes an upper surface 61a, the lower surface 61b, an outer wall surface 61g, and a recess 71A, at an end along a direction (for example, a +X-direction, or a −X-direction) perpendicular to the direction in which the vapor Cv of the working fluid C flows. The upper surface 61a of the metal layer 61 is exposed to the outside. A portion of the lower surface 61*b* of the metal layer 61 is in contact with an upper surface 62*a* of the metal layer 62. A portion of the lower surface 61*b* of the metal layer 61, not in contact with an upper surface 62*a* of the metal layer 62, is exposed to the outside. The upper surface 61*a* is an example of a first principal surface (or plane) that is perpendicular to a thickness direction (Z-direction) of the metal layer 61. The lower surface 61*b* is an example of a second principal surface (or plane) that is perpendicular to the thickness direction of the metal layer 61. The outer wall surface 61*g* of the metal layer 61 is exposed to the outside. The recess 71A is formed to cave in from the upper surface 61*a* toward an approximate center portion along the thickness direction of the metal layer 61. A surface of the recess 71A is provided to connect the upper surface 61*a* and the outer wall surface 61*g* of the metal layer 61. In other words, the recess 71A is formed in portions of the upper surface 61*a* and the outer wall surface 61*g*. The surface of recess 71A is sloped from the upper surface 61*a* to the outer wall surface 61*g* of metal layer 61. As illustrated in FIG. 3, the recess 71A is formed so as to extend along the direction (Y-direction) in which the vapor Cv of the working fluid C flows. The recess 71A is famed so that a space inside the recess 71A communicates to an outer portion of the vapor pipe 30. A fin 61*f* is formed under the recess 71A of the metal layer 61. The fin 61*f* includes the outer wall surface 61*g* of the metal layer 61, the lower surface 61*b* of the metal layer 61 exposed to the outside, and the surface of the recess 71A. The recess 71A is an example of a first recess.

In the two pipe walls 90, the metal layer 62 includes the upper surface 62*a*, a lower surface 62*b*, the inner wall surface 62*s*, an outer wall surface 62*g*, and a recess 72A, at the end along the direction (for example, the +X-direction or the −X-direction) perpendicular to the direction in which the vapor Cv of the working fluid C flows. The upper surface 62*a* of the metal layer 62 is in contact with the lower surface 61*b* of the metal layer 61. A portion of the lower surface 62*b* of the metal layer 62 is in contact with an upper surface 63*a* of the metal layer 63. A portion of the lower surface 62*b* of the metal layer 62, not in contact with the upper surface 63*a* of the metal layer 63, is exposed to the outside. The inner wall surface 62*s* of the metal layer 62 is exposed to the passage 50. The outer wall surface 62*g* of the metal layer 62 is positioned on the side opposite from the inner wall surface 62*s*, and is exposed to the outside. The recess 72A is formed to cave in from the upper surface 62*a* toward an approximate center portion along the thickness direction of the metal layer 62. The surface of the recess 72A is provided to connect the upper surface 62*a* and the outer wall surface 62*g* of the metal layer 62. In other words, the recess 72A is formed in portions of the upper surface 62*a* and the outer wall surface 62*g*. The surface of recess 72A is sloped from the upper surface 62*a* to the outer wall surface 62*g* of the metal layer 62. As illustrated in FIG. 3, the recess 72A is formed so as to extend along the direction (Y-direction) in which the vapor Cv of the working fluid C flows. The recess 72A is formed so that a space inside the recess 72A communicates to the outer portion of the vapor pipe 30. A fin 62*f* is formed under the recess 72A of metal layer 62. The fin 62*f* includes the outer wall surface 62*g* of metal layer 62, the lower surface 62*b* of the metal layer 62 exposed to the outside, and the surface of recess 72A. The recess 72A is an example of the first recess.

In the two pipe walls 90, the metal layer 63 includes the upper surface 63*a*, a lower surface 63*b*, the inner wall surface 63*s*, an outer wall surface 63*g*, and a recess 73A at the end along the direction (for example, the +X-direction or the −X-direction) perpendicular to the direction in which the vapor Cv of the working fluid C flows. The upper surface 63*a* of the metal layer 63 is in contact with the lower surface 62*b* of the metal layer 62. A portion of the lower surface 63*b* of the metal layer 63 is in contact with an upper surface 64*a* of the metal layer 64. A portion of the lower surface 63*b* of the metal layer 63, not in contact with the upper surface 64*a* of the metal layer 64, is exposed to the outside. The inner wall surface 63*s* of the metal layer 63 is exposed to the passage 50. The outer wall surface 63*g* of the metal layer 63 is positioned on the side opposite from the inner wall surface 63*s*, and is exposed to the outside. The recess 73A is formed to cave in from the upper surface 63*a* toward an approximate center portion along the thickness direction of the metal layer 63. The surface of the recess 73A is provided to connect the upper surface 63*a* and the outer wall surface 63*g* of the metal layer 63. In other words, the recess 73A is formed in portions of the upper surface 63*a* and the outer wall surface 63*g*. The surface of recess 73A us sloped from the upper surface 63*a* to the outer wall surface 63*g* of the metal layer 63. As illustrated in FIG. 3, the recess 73A is formed so as to extend along the direction (Y-direction) in which the vapor Cv of the working fluid C flows. The recess 73A is formed so that a space inside the recess 73A communicates to the outer portion of the vapor pipe 30. A fin 63*f* is formed under the recess 73A of the metal layer 63. The fin 63*f* includes the outer wall surface 63*g* of metal layer 63, the lower surface 63*b* of the metal layer 63 exposed to the outside, and the surface of recess 73A. The recess 73A is an example of the first recess.

In the two pipe walls 90, the metal layer 64 includes the upper surface 64*a*, a lower surface 64*b*, the inner wall surface 64*s*, an outer wall surface 64*g*, and a recess 74A at the end along the direction (for example, the +X-direction or the −X-direction) perpendicular to the direction in which the vapor Cv of the working fluid C flows. The upper surface 64*a* of the metal layer 64 is in contact with the lower surface 63*b* of the metal layer 63. A portion of the lower surface 64*b* of the metal layer 64 is in contact with an upper surface 65*a* of the metal layer 65. A portion of the lower surface 64*b* of the metal layer 64, not in contact with the upper surface 65*a* of the metal layer 65, is exposed to the outside. The inner wall surface 64*s* of the metal layer 64 is exposed to the passage 50. The outer wall surface 64*g* of the metal layer 64 is positioned on the side opposite from the inner wall surface 64, and is exposed to the outside. The recess 74A is formed to cave in from the upper surface 64*a* toward an approximate center portion along the thickness direction of the metal layer 64. The surface of recess 74A is provided to connect the upper surface 64*a* and the outer wall surface 64*g* of the metal layer 64. In other words, the recess 74A is formed in portions of the upper surface 64*a* and the outer wall surface 64*g*. The surface of recess 74A is sloped from the upper surface 64*a* to the outer wall surface 64*g* of the metal layer 64. As illustrated in FIG. 3, the recess 74A is formed so as to extend along the direction (Y-direction) in which the vapor Cv of the working fluid C flows. The recess 74A is formed so that a space inside the recess 74A communicates to the outer portion of the vapor pipe 30. A fin 64*f* is formed under the recess 74A of the metal layer 64. The fin 64*f* includes the outer wall surface 64*g* of metal layer 64, the lower surface 64*b* of the metal layer 64 exposed to the outside, and the surface of recess 74A. The recess 74A is an example of the first recess.

In the two pipe walls 90, the metal layer 65 includes the upper surface 65*a*, a lower surface 65*b*, the inner wall surface 65*s*, an outer wall surface 65*g*, and a recess 75A at the end along the direction (for example, the +X-direction or the −X-direction) perpendicular to the direction in which the vapor Cv of the working fluid C flows. The upper surface 65a of the metal layer 65 is in contact with the lower surface 64b of the metal layer 64. A portion of the lower surface 65b of the metal layer 65 is in contact with the upper surface 66a of the metal layer 66. A portion of the lower surface 65b of the metal layer 65, not in contact with the upper surface 66a of the metal layer 66, is exposed to the outside. The inner wall surface 65s of the metal layer 65 is exposed to the passage 50. The outer wall surface 65g of the metal layer 65 is positioned on the side opposite from the inner wall surface 65s, and is exposed to the outside. The recess 75A is formed to cave in from the upper surface 65a toward an approximate center portion along the thickness direction of the metal layer 65. The surface of the recess 75A is provided to connect the upper surface 65a and the outer wall surface 65g of the metal layer 65. In other words, the recess 75A is formed in portions of the upper surface 65a and the outer wall surface 65g. The surface of the recess 75A is sloped from the upper surface 65a to the outer wall surface 65g of the metal layer 65. As illustrated in FIG. 3, the recess 75A is formed so as to extend along the direction (Y-direction) in which the vapor Cv of the working fluid C flows. The recess 75A is formed so that a space inside the recess 75A communicates to the outer portion of the vapor pipe 30. A fin 65f is formed under the recess 75A of the metal layer 65. The fin 65f includes the outer wall surface 65g of the metal layer 65, the lower surface 65b of the metal layer 65 exposed to the outside, and the surface of the recess 75A. The recess 75A is an example of the first recess.

In the two pipe walls 90, the metal layer 66 includes the upper surface 66a, a lower surface 66b, the outer wall surface 66g, and a recess 76A at the end along the direction (for example, the +X-direction or the −X-direction) perpendicular to the direction in which the vapor Cv of the working fluid C flows. The upper surface 66a of the metal layer 66 is in contact with the lower surface 65b of the metal layer 65. The lower surface 66b of the metal layer 66 is exposed to the outside. The outer wall surface 66 of the metal layer 66 is exposed to the outside. The recess 76A is formed to cave in from the upper surface 66a toward an approximate center portion along the thickness direction of the metal layer 66. The surface of the recess 76A is provided to connect the upper surface 66a and the outer wall surface 66g of the metal layer 66. In other words, the recess 76A is formed in portions of the upper surface 66a and the outer wall surface 66g. The surface of recess 76A is sloped from the upper surface 66a to the outer wall surface 66g of the metal layer 66. As illustrated in FIG. 3, the recess 76A is formed so as to extend along the direction (the Y-direction) in which the vapor Cv of the working fluid C flows. The recess 76A is formed so that a space inside the recess 76A communicates to the outer portion of the vapor pipe 30. A fin 66f is formed under the recess 76A of the metal layer 66. The fin 66f includes the outer wall surface 66g of metal layer 66, the lower surface 62b of metal layer 62, and the surface of recess 76A. The recess 76A is an example of the first recess.

The recesses 71A through 76A may be formed in a range of approximately 25 μm to approximately 150 μm from the outer wall surfaces 61g through 66g of the metal layers 61 through 66, respectively. The depth of recesses 71A through 76A may be approximately one-half the thickness of metal layers 61 through 66, for example.

In the vapor pipe 30 having the above described structure, the recesses 71A through 76A are formed in the pipe wall 90. For this reason, compared to a case where the pipe wall 90 has a flat surface having no recesses 71A through 76A formed therein, the pipe wall 90 can have a large contact area with ambient air, and improve the heat dissipation efficiency. In other words, the heat of the vapor Cv is easily released to the outside while the vapor Cv flows through the vapor pipe 30.

In this embodiment, the recesses 71A through 76A are formed to cave in from the upper surfaces 61a through 66a of the metal layers 61 through 66 toward the approximate center portions along the thickness direction of the metal layers 61 through 66, respectively, but the recesses 71A through 76A are not limited to such a structure. For example, the recesses 71A through 76A may be formed to cave in from the lower surfaces 61b through 66b of the metal layers 61 through 66 toward the approximate center portions along the thickness direction of the metal layers 61 through 66, respectively.

Figure 5:
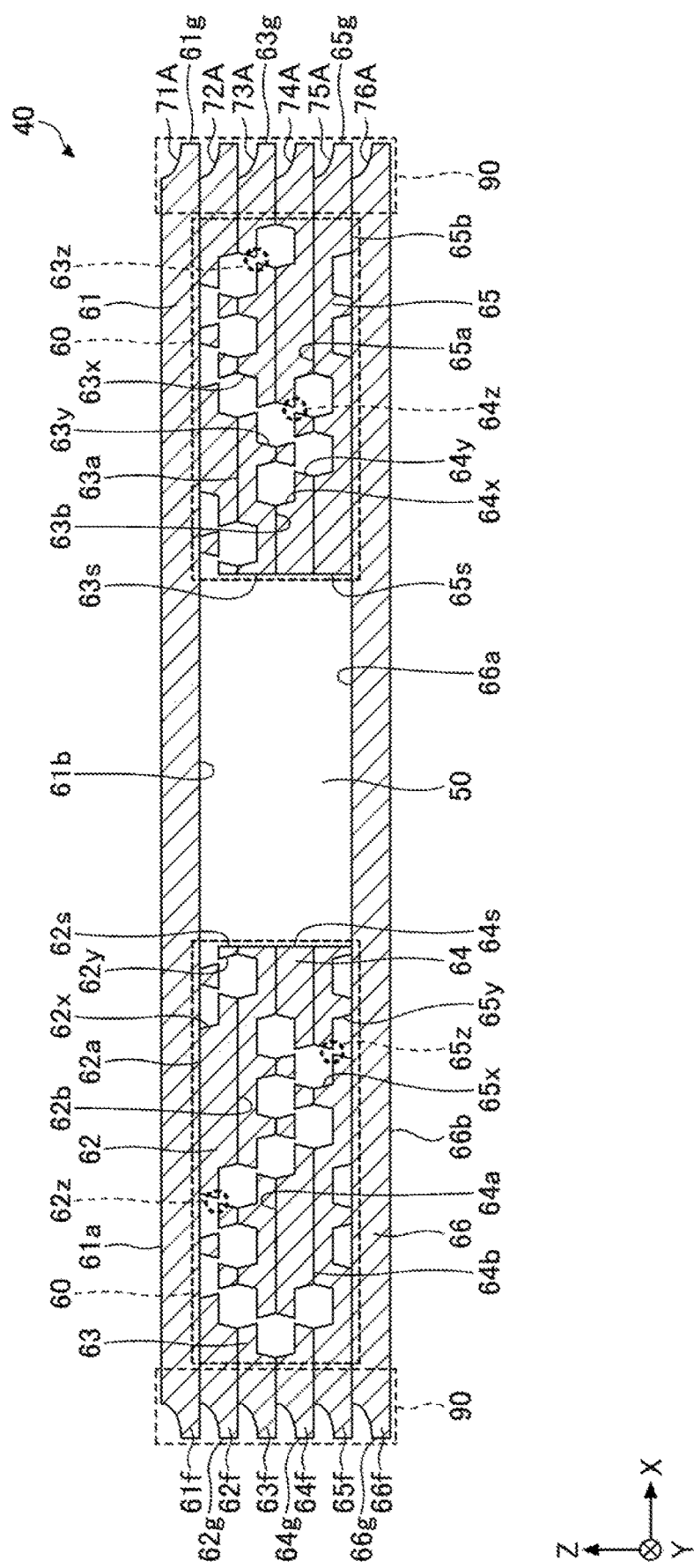
FIG. 5 is a cross sectional view illustrating an example of a liquid pipe and a porous body inside the liquid pipe according to the first embodiment.

Next, the liquid pipe 40 will be described. FIG. 5 is a cross sectional view illustrating an example of the liquid pipe and a porous body inside the liquid pipe according to the first embodiment. FIG. 5 illustrates the cross section along a line B-B in FIG. 1.

The pipe wall 90 of the liquid pipe 40 has a structure similar to the structure of the pipe wall 90 of the vapor pipe 30. In other words, the recesses 71A through 76A are also formed in the pipe wall 90 of the liquid pipe 40. Accordingly, compared to the case where the pipe wall 90 has the flat surface having no recesses 71A through 76A formed therein, the pipe wall 90 can have the large contact area with the ambient air, and improve the heat dissipation efficiency. In other words, the heat of the working fluid C is easily released to the outside while the working fluid C flows through the liquid pipe 40.

Further, as illustrated in FIG. 5, a porous body 60 is provided inside the liquid pipe 40. The porous body 60 is provided at two locations inside the liquid pipe 40. A first porous body 60 is formed continuously with one pipe wall 90 of the liquid pipe 40, and a second porous body 60 is formed continuously with the other pipe wall 90 of the liquid pipe 40. The passage 50, through which the working fluid C flows, is formed between the surface of the first porous body 60 opposing the second porous body 60, and the surface of the second porous body 60 opposing the first porous body 60. The porous body 60 will be described in the following in more detail.

FIG. 6A through FIG. 6D are plan views illustrating the arrangement of bottomed holes in each of the second through fifth metal layers. In FIG. 6A through FIG. 6D, a portion illustrated by a line A-A corresponds to the cross section of the porous body 60 in FIG. 5. A bottomed hole formed in a layer does not penetrate the layer. The bottomed hole caves in from one surface of the layer, but does not reach the other surface of the layer on the side opposite from the one surface of the layer. Hence, the bottomed hole caves in from the one surface of the layer to an intermediate portion along the thickness direction of the layer.

The porous body 60 may have a structure in which the four metal layers 62 through 65 are laminated, for example. The metal layers 62 through 65 are copper layers having an excellent thermal conductivity, for example, and are directly bonded to each other by solid-phase bonding or the like. The thickness of each of the metal layers 61 through 66 may be in a range of approximately 50 μm to approximately 200 μm, for example. The metal layers 61 through 66 are not limited to the copper layers, and may be formed by a stainless steel layer, an aluminum layer, a magnesium alloy layer, or the like, for example. In addition, the number of metal layers that are laminated is not particularly limited, and the number of metal layers that are laminated may be 5 or less, or 7 or more.

In FIG. 5 and FIG. 6A through FIG. 6D, the laminating direction of the metal layers 61 through 66 is in the Z-direction, the arbitrary direction within the plane perpendicular to the Z-direction is the X-direction, and the direction within this plane and perpendicular to the X-direction is the Y-direction. The same definitions of the directions apply to other figures.

Figure 6A:
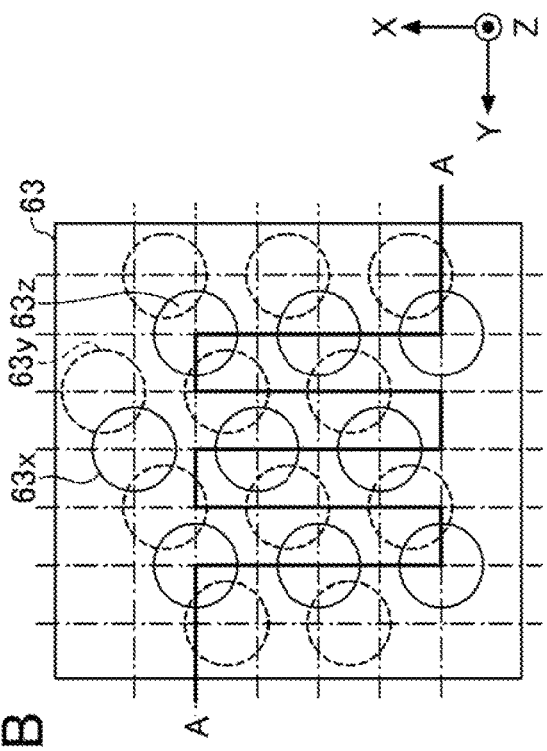
FIG. 6A, FIG. 6B, FIG. 6C, and FIG. 6D are plan views illustrating arrangements of bottomed holes in each of second through fifth metal layers.

The porous body 60 is in contact with the lower surface of the first metal layer (one outermost metal layer) 61 and the upper surface of the sixth metal layer (the other outermost metal layer) 66. No holes or grooves are formed in the metal layer 61 and the metal layer 66. On the other hand, as illustrated in FIG. 5 and FIG. 6A, a plurality of bottomed holes 62x and a plurality of bottomed holes 62y are formed in the second metal layer 62 forming the porous body 60. The bottomed hole caves in from the upper surface of the second metal layer 62 towards an approximate center portion along the thickness direction of the second metal layer 62. The bottomed hole 62y caves in from the lower surface of the second metal layer 62 towards the approximate center portion along the thickness direction of the second metal layer 62.

The bottomed hole 62x and the bottomed hole 62y are alternately arranged along the X-direction in the plan view. In addition, the bottomed hole 62x and the bottomed hole 62y are alternately arranged along the Y-direction in the plan view. The bottomed hole 62x and the bottomed hole 62y that are alternately arranged along the X-direction partially overlap each other in the plan view, and the overlapping portions of the bottomed holes 62x and 62y communicate with each other to form a pore 62z. The bottomed holes 62x and bottomed holes 62y that are alternately arranged along the Y-direction are formed with a predetermined spacing therebetween, and do not overlap in the plan view. For this reason, the bottomed hole 62x and the bottomed hole 62y that are alternately arranged along the Y-direction do not form a pore.

The bottomed holes 62x and 62y may have a circular shape with a diameter in a range of approximately 100 μm to approximately 300 μm, for example, but may have arbitrary shapes, such as an oval shape, a polygonal shape, or the like. The depth of the bottomed holes 62x and 62y may be approximately one-half the thickness of the metal layer 62, for example. A spacing $L_1$ of the adjacent bottomed holes 62x may be in a range of approximately 100 μm to approximately 400 μm, for example. A spacing $L_2$ of the adjacent bottomed holes 62y may be in a range of approximately 100 μm to approximately 400 μm, for example.

Inner walls of the bottomed holes 62x and 62y may have a tapered shape that widens from a bottom surface thereof toward an opening thereof. However, the inner walls of the bottomed holes 62x and 62y are not limited to such a tapered shape, and may be perpendicular (or vertical) with respect to the bottom surface thereof. The shape of the inner wall surfaces of the bottomed holes 62x and 62y is not limited to the tapered shape and the vertical shape. For example, the inner wall surfaces of the bottomed holes 62x and 62y may have a concave shape formed by a curved surface. The concave shape formed by the curved surface includes concave shapes having cross sectional shapes that are approximately semi-circular, approximately semi-oval, or the like, for example. A width $W_3$ of the pore 62z along a short direction thereof may be in a range of approximately 10 μm to approximately 50 μm, for example. Further, a width $W_4$ of the pore 62z along a longitudinal direction thereof may be in a range of approximately 50 μm to approximately 150 μm, for example.

Figure 6B:
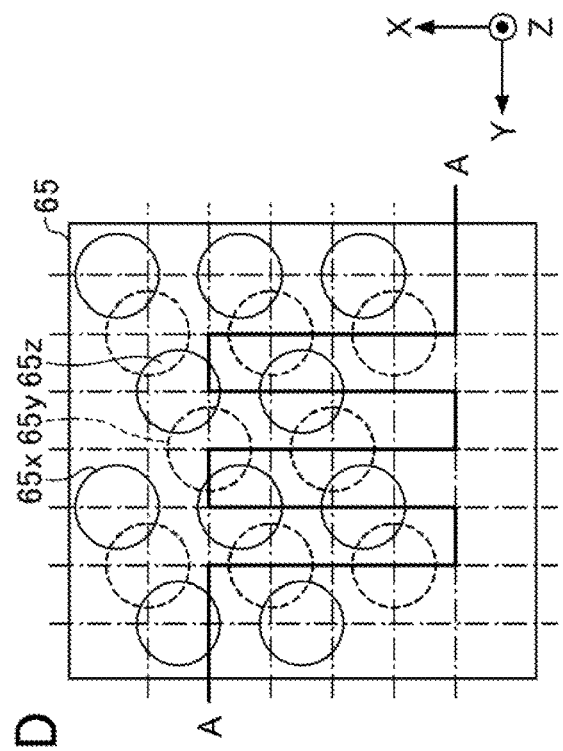

As illustrated in FIG. 5 and FIG. 6B, a plurality of bottomed holes 63x and a plurality of bottomed holes 63y are formed in the third metal layer 63 forming the porous body 60. The bottomed hole 63x caves in from the upper surface of the third metal layer 63 towards an approximate center portion along the thickness direction of the third metal layer 63. The bottomed hole 63y caves in from the lower surface of the third metal layer 63 towards the approximate center portion along the thickness direction of the third metal layer 63.

In the metal layer 63, a column in which only the bottomed holes 63x are arranged along the X-direction, and a column in which only the bottomed holes 63y are arranged along the X-direction, are alternately arranged along the Y-direction. In the columns that are alternately arranged along the Y-direction, the bottomed hole 63x and the bottomed hole 63y in the adjacent columns partially overlap each other in the plan view, and the overlapping portions of the bottomed holes 63x and 63y communicate with each other to form a pore 63z.

However, center positions of the adjacent bottomed holes 63x and 63y forming the pore 63z are offset along the X-direction. In other words, the bottomed holes 63x and 63y forming the pore 63z are alternately arranged along an oblique direction with respect to the X and Y-directions. The shape of the bottomed holes 63x and 63y, the shape of the pore 63z, or the like may be similar to the shape of the bottomed holes 62x and 62y, the shape of the pore 62z, or the like.

The bottomed hole 62y of the metal layer 62 and the bottomed hole 63x of the metal layer 63 are formed at overlapping positions in the plan view. For this reason, no pores are formed at the interface between the metal layer 62 and the metal layer 63.

Figure 6C:
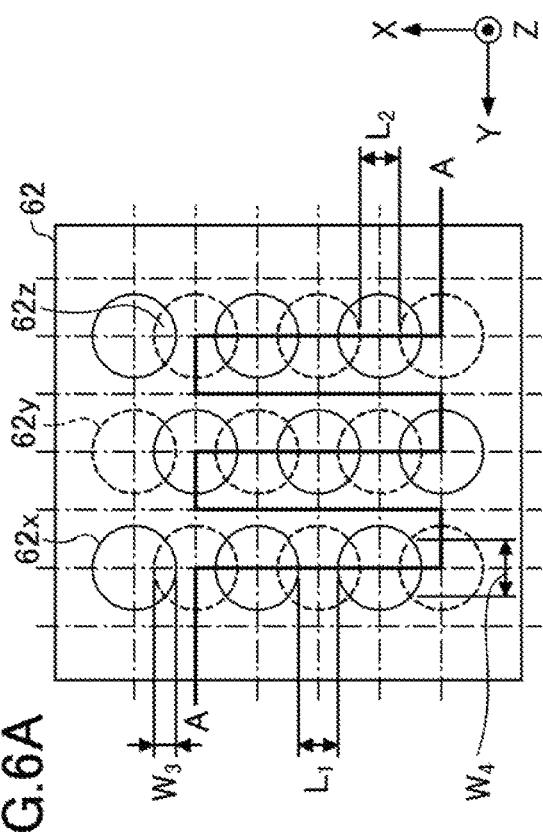

As illustrated in FIG. 5 and FIG. 6C, a plurality of bottomed holes 64x and a plurality of bottomed holes 64y are formed in the fourth metal layer 64 forming the porous body 60. The bottomed hole 64x caves in from the upper surface of the fourth metal layer 64 towards an approximate center portion along the thickness direction of the fourth metal layer 64. The bottomed hole 64y caves in from the lower surface of the fourth metal layer 64 towards the approximate center portion along the thickness direction of the fourth metal layer 64.

The bottomed hole 64x and the bottomed hole 64y are alternately arranged along the X-direction in the plan view. In addition, the bottomed hole 64x and the bottomed hole 64y are alternately arranged along the Y-direction in the plan view. The bottomed hole 64x and the bottomed hole 64y that are alternately arranged along the X-direction partially overlap each other in the plan view, and the overlapping portions of the bottomed holes 64x and 64y communicate with each other to form a pore 64z. The bottomed holes 64x and bottomed holes 64y that are alternately arranged along the Y-direction are formed with a predetermined spacing therebetween, and do not overlap in the plan view. For this reason, the bottomed hole 64x and the bottomed hole 64y that are alternately arranged along the Y-direction do not form a pore. The shape of the bottomed holes 64x and 64y, the shape of the pore 64z, or the like may be similar to the shape of the bottomed holes 62x and 62y, the shape of the pore 62z, or the like.

The bottomed hole 63y of the metal layer 63 and the bottomed hole 64x of the metal layer 64 are formed at overlapping positions in the plan view. For this reason, no pores are formed at the interface between the metal layer 63 and the metal layer 64.

Figure 6D:
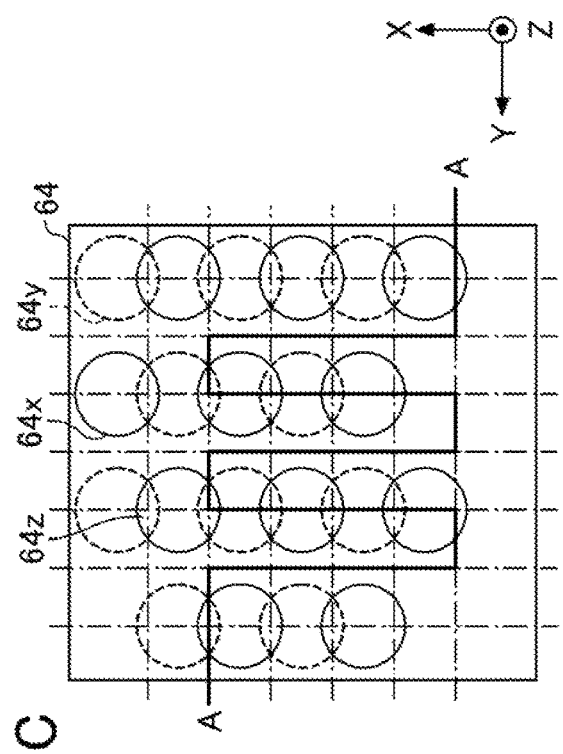

As illustrated in FIG. 5 and FIG. 6D, a plurality of bottomed holes 65x and a plurality of bottomed holes 65y are formed in the fifth metal layer 65 forming the porous body 60. The bottomed hole 65x caves in from the upper surface of the fifth metal layer 65 towards an approximate center portion along the thickness direction of the fifth metal layer 65. The bottomed hole 65y caves in from the lower surface of the fifth metal layer 65 towards the approximate center portion along the thickness direction of the fifth metal layer 65.

In the metal layer 65, a column in which only the bottomed holes 65x are arranged along the X-direction, and a column in which only the bottomed holes 65y are arranged along the X-direction, are alternately arranged along the Y-direction. In the columns that are alternately arranged along the Y-direction, the bottomed hole 65x and the bottomed hole 65y in the adjacent columns partially overlap each other in the plan view, and the overlapping portions of the bottomed holes 65x and 65y communicate with each other to form a pore 65z.

However, center positions of the adjacent bottomed holes 65x and 65y forming the pore 65z are offset along the X-direction. In other words, the bottomed holes 65x and 65y forming the pore 65z are alternately arranged along an oblique direction with respect to the X and Y-directions. The shape of the bottomed holes 65x and 65y, the shape of the pore 65z, or the like may be similar to the shape of the bottomed holes 62x and 62y, the shape of the pore 62z, or the like.

The bottomed hole 64y of the metal layer 64 and the bottomed hole 65x of the metal layer 65 are formed at overlapping positions in the plan view. For this reason, no pores are formed at the interface between the metal layer 64 and the metal layer 65.

The pores formed in each of the metal layers communicate with each other, and the mutually communicating pores spread three-dimensionally inside the porous body 60. For this reason, the working fluid C spreads three-dimensionally through the mutually communicating pores due to a capillary force.

At least a portion of the bottomed holes forming the porous body 60 communicate to the passage 50. Hence, the working fluid C can permeate into the porous body 60. Because the porous body 60 is provided at an approximate center portion of the liquid pipe 40, the porous body 60 can also function as a support. Hence, it is possible to prevent the liquid pipe 40 from collapsing due to the applied pressure during the solid-phase bonding, for example.

Accordingly, the porous body 60 is provided inside the liquid pipe 40, and the porous body 60 extends along the liquid pipe 40 to a proximity of the evaporator 10. Thus, the capillary force generated in the porous body 60 guides the working fluid C in the liquid phase inside the liquid pipe 40 to the evaporator 10.

As a result, a backflow of the vapor Cv into the liquid pipe 40 due to a heat leak or the like from the evaporator 10, can be pushed back due to the capillary force from the porous body 60 acting on the working fluid C in the liquid phase, thereby preventing the backflow of the vapor Cv.

Although an inlet (not illustrated) for injecting the working fluid C is formed in the liquid pipe 40, the inlet is sealed by a sealing member, and the inside of the loop heat pipe 1 is maintained airtight.

The pipe wall 90 of the evaporator 10 also has a structure similar to the structure of the pipe wall 90 of the evaporator 10. In other words, the recesses 71A through 76A are also formed in the pipe wall 90 of the liquid pipe 40. Accordingly, compared to the case where the pipe wall 90 has the flat surface having no recesses 71A through 76A formed therein, the pipe wall 90 can have the large contact area with the ambient air, and improve the heat dissipation efficiency. In other words, the heat of the working fluid C and the vapor Cv thereof is easily released to the outside while the working fluid C and the vapor Cv flow through the evaporator 10.

A porous body is also provided inside the evaporator 10. The working fluid C from the liquid pipe 40 is guided to the evaporator 10, and penetrates into the porous body inside the evaporator 10. The working fluid C penetrated into the porous body inside the evaporator 10 is vaporized by the heat generated by the heating-generating component 120 to generate the vapor Cv, and the vapor Cv flows to the vapor pipe 30.

The porous body provided inside the evaporator 10 is similar in principle to the porous body 60 provided inside the liquid pipe 40. For example, the positions of the bottomed holes and the pores formed in the metal layers 62 through 65 may be similar to those illustrated in FIG. 5 and FIG. 6A through FIG. 6D.

The pipe wall 90 of the condenser 20 also has a structure similar to the structure of the pipe wall 90 of the vapor pipe 30. In other words, the recesses 71A through 76A are also formed in the pipe wall 90 of the condenser 20. Accordingly, compared to the case where the pipe wall 90 has the flat surface having no recesses 71A through 76A formed therein, the pipe wall 90 can have the large contact area with the ambient air, and improve the heat dissipation efficiency. In other words, the heat of the working fluid C and the vapor Cv thereof is easily released to the outside while the working fluid C and the vapor Cv flow through the condenser 20.

[Method for Manufacturing Loop Heat Pipe According to First Embodiment]

Next, a method for manufacturing the loop heat pipe according to the first embodiment will be described, by focusing on a porous body manufacturing process (or step). FIG. 7A to FIG. 11B illustrate an example of manufacturing processes (or steps) of the loop heat pipe according to the first embodiment. FIG. 7A through FIG. 7D, FIG. 9A through FIG. 9D, FIG. 10A, and FIG. 10B illustrate cross sections corresponding to FIG. 4, and FIG. 8A through FIG. 8D, FIG. 11A, and FIG. 11B illustrate cross sections corresponding to FIG. 5. FIG. 9A through FIG. 9D illustrate cross sections corresponding to FIG. 4. In each of the processes illustrated in FIG. 9A through FIG. 9D, a process similar to the process performed with respect to the cross section corresponding to FIG. 4 is also performed with respect to the cross section corresponding to FIG. 5.

First, in the processes illustrated in FIG. 7A and FIG. 8A, a metal sheet 620 formed in the planar shape of FIG. 1 is prepared. A resist layer 310 is formed on an upper surface of the metal sheet 620, and a resist layer 320 is formed on a lower surface of the metal sheet 620. The metal sheet 620 is a member that ultimately becomes the metal layer 62, and may be formed from copper, stainless steel, aluminum, magnesium alloys, or the like, for example. The thickness of the metal sheet 620 may be in a range of approximately 50 to approximately 200 μm, for example. The resist layers 310 and 320 may be a photosensitive dry film resist or the like, for example.

Next, in the processes illustrated in FIG. 7B and FIG. 8B, the resist layer 310 is exposed and developed in regions of the metal sheet 620 where the porous body 60 is to be famed (the region that becomes the evaporator 10 and the region that becomes the liquid pipe 40), to form an opening 310x that selectively exposes the upper surface of the metal sheet 620. The resist layer 320 is also exposed and developed to form an opening 320x that selectively exposes the lower surface of the metal sheet 620. The openings 310x and 320x are formed with shapes and arrangements corresponding to the shapes and arrangements of the bottomed holes 62x and 62y illustrated in FIG. 6A.

During the exposure and development of the resist layer 310, an opening 310y is also formed to selectively expose the upper surface of the metal sheet 620 in a region where the recess 72A of the metal sheet 620 is to be formed, and an opening 310z is also formed to selectively expose the upper surface of the metal sheet 620 in a region where the passage 50 is to be formed, as illustrated in FIG. 7B and FIG. 8B. Moreover, during the exposure and development of the resist layer 320, an opening 320z is also formed to selectively expose the lower surface of the metal sheet 620 in a region where the passage 50 is to be formed, as illustrated in FIG. 7B and FIG. 8B. The shape and arrangement of the openings 310y are formed to correspond to the shape and arrangement of the recesses 72A illustrated in FIG. 3 through FIG. 5, and the shape and arrangement of the openings 310z and 320z are formed to correspond to the shape and arrangement of the passage 50 illustrated in FIG. 4 and FIG. 5.

Next, in the processes illustrated in FIG. 7C and FIG. 8C, the metal sheet 620, exposed within the openings 310x, 310y, and 310z, is half-etched from the upper surface of the metal sheet 620, while the metal sheet 620, exposed within the openings 320x and 320z, is half-etched from the lower surface of the metal sheet 620. Hence, the bottomed hole 62x, and the recess 72A formed by the bottomed hole, are formed in the upper surface of the metal sheet 620. In addition, the bottomed hole 62y is formed in the lower surface of the metal sheet 620, and a through hole is formed in the metal sheet 620 to penetrate the metal sheet 620. This through hole includes the inner wall surface 62s. Further, since the openings 310x and the openings 320x that are alternately arranged along the X-direction in the upper and lower surfaces of the metal sheet 620, respectively, partially overlap each other in the plan view, the overlapping portions of the openings 310x and 320x communicate with each other to form the pore 62z. The half-etching of the metal sheet 620 may use a ferric chloride solution, for example.

Next, in the processes illustrated in FIG. 7D and FIG. 8D, the resist layers 310 and 320 are removed by a stripping agent or solution. The metal layer 62 is completed in this manner.

In the process illustrated in FIG. 9A, a metal sheet 610 formed in the planar shape of FIG. 1 is prepared. Then, a resist layer 410 is formed on an upper surface of the metal sheet 610, and a resist layer 420 is formed on a lower surface of the metal sheet 610. The metal sheet 610 is a member that ultimately becomes the metal layer 61, and may be formed from copper, stainless steel, aluminum, magnesium alloys, or the like, for example. The thickness of the metal sheet 610 may be in a range of approximately 50 μm to approximately 200 μm, for example.

Next, in the process illustrated in FIG. 9B, the resist layer 410 is exposed and developed in regions of the metal sheet 610 where the recess 71A is to be formed, to form an opening 410y that selectively exposes the upper surface of the metal sheet 610. The opening 410y is formed with a shape and an arrangement corresponding to the shape and the arrangement of the recess 71A illustrated in FIG. 3 through FIG. 5.

Next, in the process illustrated in FIG. 9C, the metal sheet 610 exposed within the opening 410y is half-etched from the upper surface of the metal sheet 610. Hence, the recess 71A, formed by the bottomed hole, is formed in the upper surface of the metal sheet 610. The half-etching of the metal sheet 610 may use a ferric chloride solution, for example.

Next, in the process illustrated in FIG. 9D, the resist layers 410 and 420 are removed a stripping agent or solution. The metal layer 61 is completed in this manner.

Next, in the processes illustrated in FIG. 10A and FIG. 11A, the metal layer 66 is formed in a manner similar to that of the metal layer 61, and metal layers 63, 64, and 65 are formed in a manner similar to that of the metal layer 62. The positions of the through-holes formed in the metal layers 63, 64, and 65 are as illustrated in FIG. 4 and FIG. 5, for example. The positions of the recesses formed in the metal layers 63, 64, 65, and 66 are as illustrated in FIG. 3 through FIG. 5, for example. The positions of the bottomed holes and pores formed in the metal layers 63, 64, and 65 are as illustrated in FIG. 6, for example.

Next, in the processes illustrated in FIG. 10B and FIG. 11B, the metal layers are laminated in the order illustrated in FIG. 10A and FIG. 11A, and the solid-phase bonding is performed by applying pressure and heat. Hence, the adjacent metal layers are directly bonded to each other, thereby completing the loop heat pipe 1 that includes the evaporator 10, the condenser 20, the vapor pipe 30, and the liquid pipe 40, and forming the porous body 60 inside the liquid pipe 40 and the evaporator 10. Then, after evacuating the inside of the liquid pipe 40 using a vacuum pump or the like, the working fluid C is injected into the liquid pipe 40 through the inlet (not illustrated), and the inlet is sealed thereafter.

The solid-phase bonding is a method of bonding two objects that are to be bonded, by softening the objects in the solid phase (solid state) thereof by applying heat, without melting the objects, and further applying pressure on the objects to cause plastic deformation and bond the objects. In order to achieve excellent bonding of the adjacent metal layers by the solid-phase bonding, all of the metal layers 61 through 66 are preferably made of the same material.

In the first embodiment, the recesses 71A through 76A are formed in each pipe wall 90 of the vapor pipe 30, the evaporator 10, the condenser 20, and the liquid pipe 40. For this reason, the contact area of each pipe wall 90 of the evaporator 10, the condenser 20, the vapor pipe 30, and the liquid pipe 40 with the ambient air is larger than the contact area with the ambient air for the case where the recesses 71A through 76A are not formed in each pipe wall 90 and each pipe wall 90 is flat. Thus, according to the first embodiment, the contact area with the ambient air is large, and the heat dissipation efficiency can be improved.

Modification of First Embodiment

A modification of the first embodiment mainly differs from the first embodiment primarily in terms of the structure of the outermost metal layers. In this modification of the first embodiment, those parts that are the same as those of the first embodiment are designated by the same reference numerals, and a repeated description of the same parts may be omitted.

Figure 12:
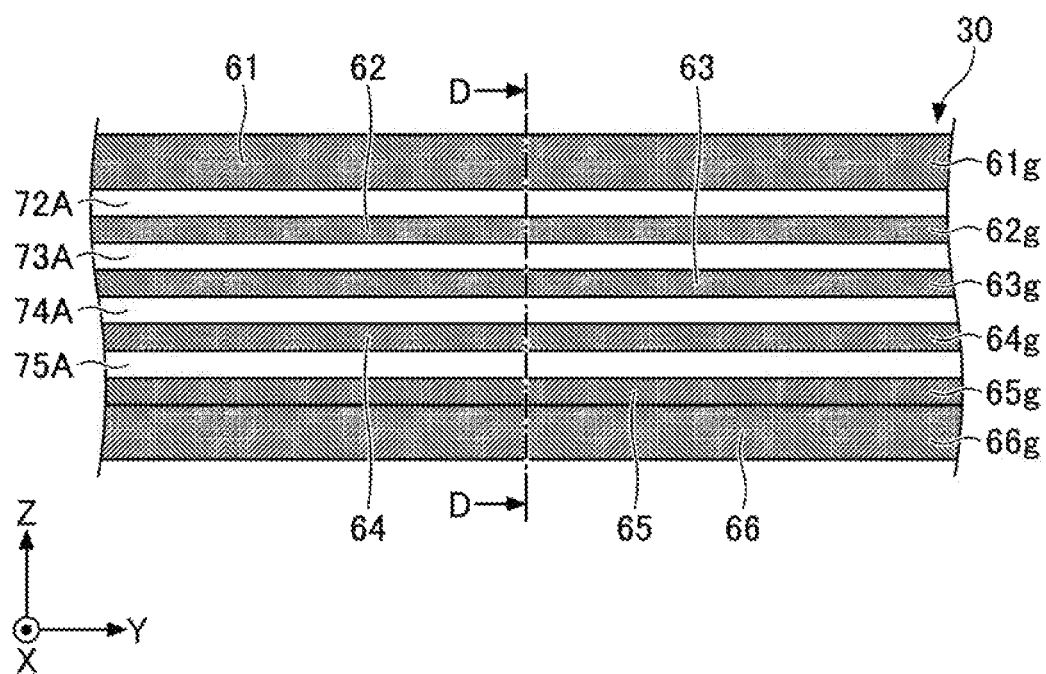
FIG. 12 is a side view illustrating an example of the vapor pipe according to a modification of the first embodiment.
Figure 13:
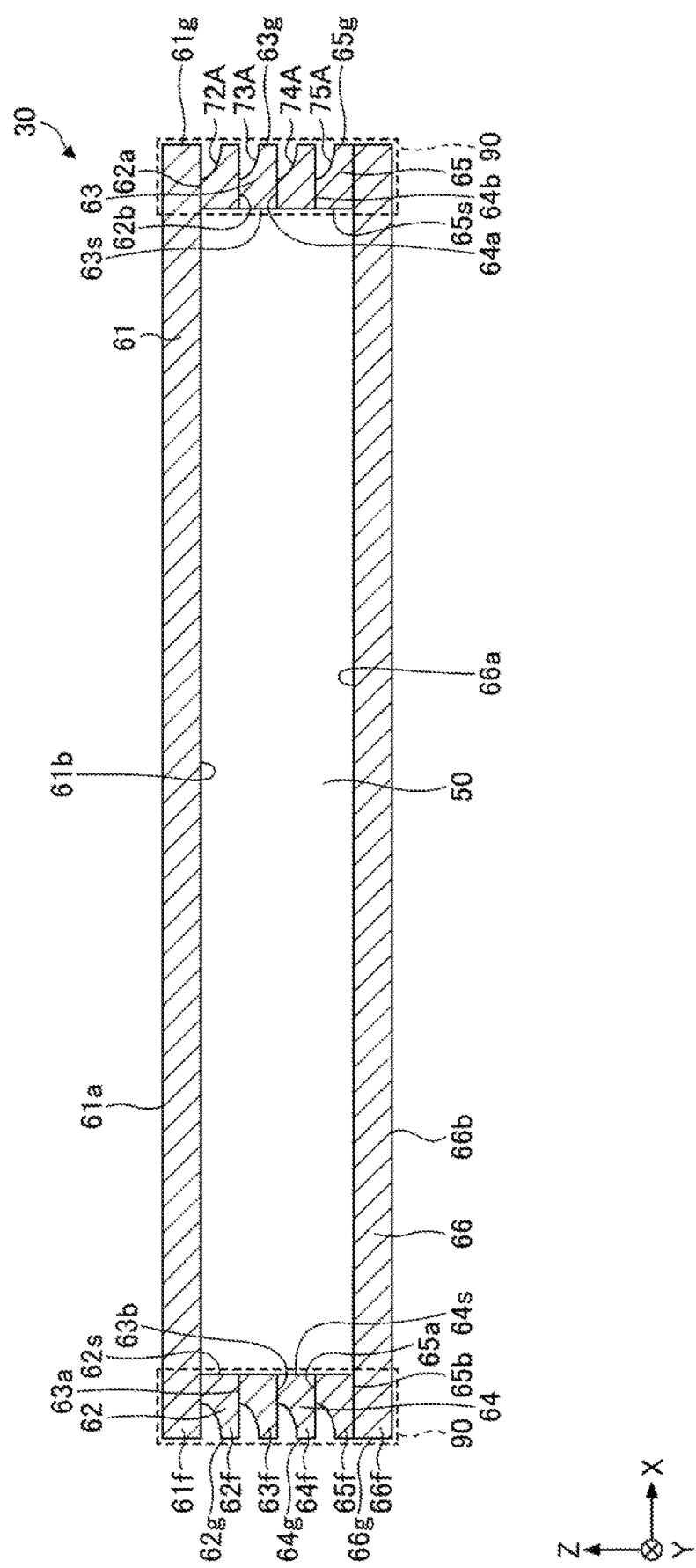
FIG. 13 is a cross sectional view illustrating the example of the vapor pipe according to the modification of the first embodiment.

FIG. 12 and FIG. 13 illustrate an example the vapor pipe according to the modification of the first embodiment. FIG.

12 is a side view viewed from the X-direction, and FIG. 13 is a cross sectional view along the line D-D in FIG. 1 and FIG. 12.

In this modification of the first embodiment, the metal layers 62 through 65 have structures similar to those of the first embodiment. On the other hand, the recess 71A is not formed in the first metal layer (one outermost metal layer) 61, and the recess 76A is not formed in the sixth metal layer (the other outermost metal layer) 66, throughout the evaporator 10, the condenser 20, the vapor pipe 30, and the liquid pipe 40. In other words, the metal layers 61 and 66 are solid metal layers having no recess, no cavity, nor hole.

Other parts of this modification have structures similar to those of the first embodiment.

The modification of the first embodiment can also improve heat dissipation efficiency compared to conventional loop heat pipes. In addition, since the metal layers 61 and 66 are solid metal layers, excellent handling can easily be secured.

Second Embodiment

A second embodiment mainly differs from the first embodiment in terms of the structure of the recess. In the second embodiment, those parts that are the same as those of the first embodiment are designated by the same reference numerals, and a repeated description of the same parts may be omitted.

Figure 14:
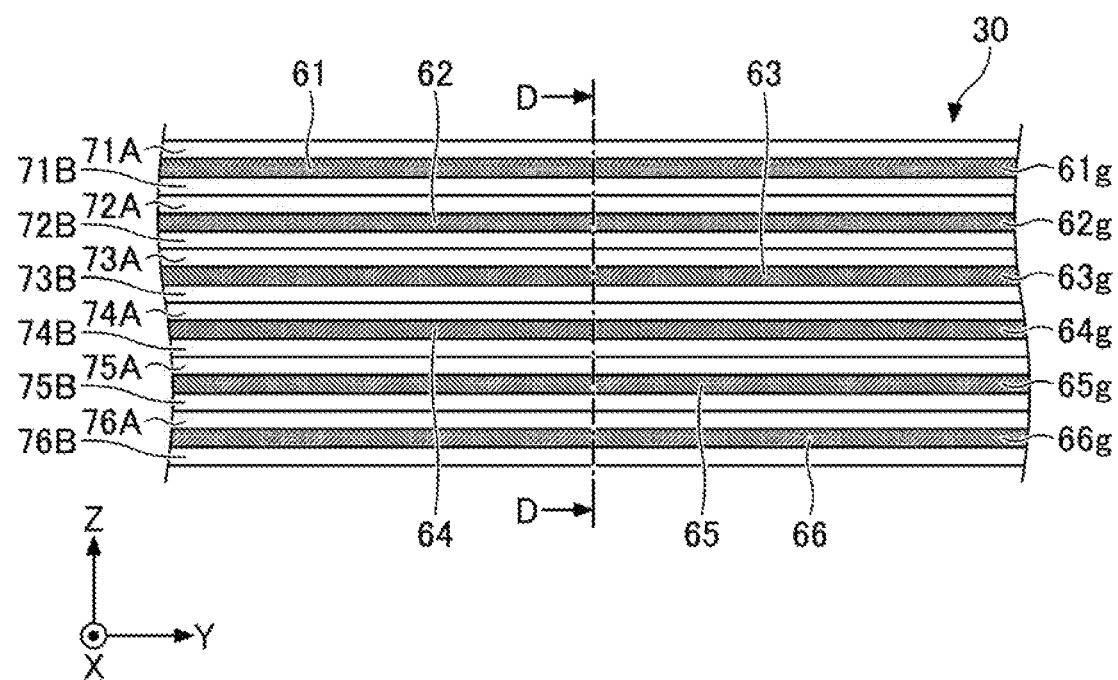
FIG. 14 is a side view illustrating an example of the vapor pipe according to a second embodiment.
Figure 15:
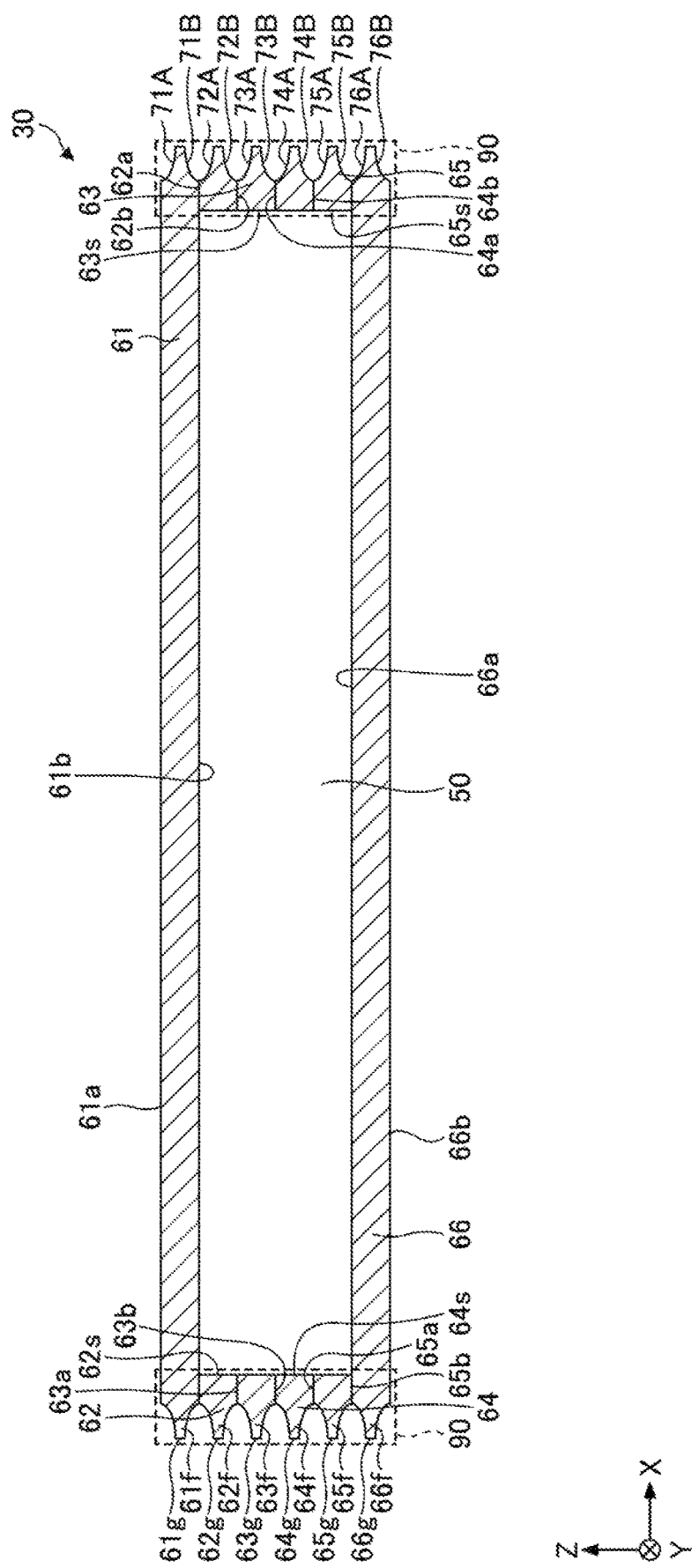
FIG. 15 is a cross sectional view illustrating the example of the vapor pipe according to the second embodiment.

FIG. 14 and FIG. 15 illustrate an example of the vapor pipe according to the second embodiment. FIG. 14 is a side view viewed from the X-direction, and FIG. 15 is a cross sectional view along the line D-D in FIG. 1 and FIG. 14.

In the second embodiment, in the two pipe walls 90, the metal layer 61 includes the upper surface 61a, the lower surface 61b, the outer wall surface 61g, the recess 71A, and a recess 71B, at the end of along the direction (for example, the +X-direction or the −X-direction) perpendicular to the direction in which the vapor Cv of the working fluid C flows. The recess 71A is formed to cave in from the upper surface 61a toward a portion closer to the upper surface 61a than the center portion along the thickness direction of the metal layer 61. The recess 71B is formed to cave in from the lower surface 61b toward a portion closer to the lower surface 61b than the center portion along the thickness direction of the metal layer 61. The surface of the recess 71B is provided to connect the lower surface 61b and the outer wall surface 61g of the metal layer 61. In other words, the recess 71B is formed in portions of the lower surface 61b and the outer wall surface 61g. The surface of the recess 71B is sloped from the lower surface 61b to the outer wall surface 61g of the metal layer 61. As illustrated in FIG. 14, the recess 71B is formed so as to extend along the direction (Y-direction) in which the vapor Cv of the working fluid C flows. The recess 71B is formed so that a space inside the recess 71B communicates to the outer portion of the vapor pipe 30. The recess 71A and the recess 71B may overlap in the plan view. The lower surface 61b of the metal layer 61 is in contact with the upper surface 62a of the metal layer 62, and a lower end of the recess 71B of the metal layer 61 is continuous with an upper end of the recess 72A of the metal layer 62. The recess 71B and the recess 72A form a recess having a U-shaped cross section in the continuous outer wall surfaces 61g and 62g. A fin 61f is formed between the recess 71A and the recess 71B of the metal layer 61. The fin 61f includes the outer wall surface 61g of the metal layer 61, the surface of the recess 71A, and the surface of the recess 71B. The recess 71B is an example of a second recess. In this embodiment, the recess 71A and the recess 71B are formed in a portion of the outer wall surface 61g. In other words, the recess 71A and the recess 71B are formed so that the outer wall surface 61g remains at a tip end of the fin 61f. However, the structure of the recesses 71A and 71B is not limited to the structure described above, and the recesses 71A and 71B may be formed so as to eliminate the outer wall surface 61g. For example, the tip end of the fin 61f may have a sharp shape.

In the two pipe walls 90, the metal layer 62 includes the upper surface 62a, the lower surface 62b, the inner wall surface 62s, the outer wall surface 62g, the recess 72A and a recess 72B, at the end along the direction (for example, the +X-direction or the −X-direction) perpendicular to the direction in which the vapor Cv of the working fluid C flows. The recess 72A is formed to cave in from the upper surface 62a toward a portion closer to the upper surface 62a than the center portion along the thickness direction of the metal layer 62. The recess 72B is formed to cave in from the lower surface 62b toward a portion closer to the lower surface 62b than the center portion along the thickness direction of the metal layer 62. The surface of the recess 72B is provided to connect the lower surface 62b and the outer wall surface 62g of the metal layer 62. In other words, the recess 72B is formed in portions of the lower surface 62b and the outer wall surface 62g. The surface of the recess 72B is sloped from the lower surface 62b to the outer wall surface 62g of the metal layer 62. As illustrated in FIG. 14, the recess 72B is formed so as to extend along the direction (Y-direction) in which the vapor Cv of the working fluid C flows. The recess 72B is formed so that a space inside the recess 72B communicates to the outer portion of the vapor pipe 30. The recess 72A and the recess 72B may overlap in the plan view. The lower surface 62b of the metal layer 62 is in contact with the upper surface 63a of the metal layer 63, and a lower end of the recess 72B of the metal layer 62 is continuous with an upper end of the recess 73A of the metal layer 63. The recess 72B and recess 73A form a recess having a U-shaped cross section in the continuous outer wall surfaces 62g and 63g. A fin 62f is formed between the recess 72A and the recess 72B of metal layer 62. The fin 62f includes the outer wall surface 62g of the metal layer 62, the surface of the recess 72A, and the surface of the recess 72B. The recess 72B is an example of the second recess. In this embodiment, the recess 72A and the recess 72B are formed in a portion of the outer wall surface 62g. In other words, the recess 72A and the recess 72B are formed so that an outer wall surface 62g remains at a tip end of the fin 62f. However, the structure of the recesses 72A and 72B is not limited to the structure described above, and the recesses 72A and 72B may be formed so as to eliminate the outer wall surface 62g. For example, the tip end of the fin 62f may have a sharp shape.

In the two pipe walls 90, the metal layer 63 includes the upper surface 63a, the lower surface 63b, the inner wall surface 63s, the outer wall surface 63g, the recess 73A, and a recess 73B, at the end along the direction (for example, the +X-direction or the −X-direction) perpendicular to the direction in which the vapor Cv of the working fluid C flows. The recess 73A is formed to cave in from the upper surface 63a toward a portion closer to the upper surface 63a than a center portion along the thickness direction of the metal layer 63. The recess 73B is formed to cave in from the lower surface 63b toward a portion closer to the lower surface 63b than the center portion along the thickness direction of the metal layer 63. The surface of the recess 73B is provided to connect the lower surface 63b and the outer wall surface 63g of the metal layer 63. In other words, the recess 73B is formed in portions of the lower surface 63b and the outer wall surface 63g. The surface of the recess 73B is sloped from the lower surface 63b to the outer wall surface 63g of the metal layer 63. As illustrated in FIG. 14, the recess 73B is formed so as to extend along the direction (Y-direction) in which the vapor Cv of the working fluid C flows. The recess 73B is formed so that a space inside the recess 73B communicates to the outer portion of the vapor pipe 30. The recess 73A and the recess 73B may overlap in the plan view. The lower surface 63b of the metal layer 63 is in contact with the upper surface 64a of the metal layer 64, and a lower end of the recess 73B of the metal layer 63 is continuous with an upper end of the recess 74A of the metal layer 64. The recess 73B and recess 74A form a recess having a U-shaped cross section in the continuous outer wall surfaces 63g and 64g. A fin 63f is formed between recess 73A and the recess 73B of metal layer 63. The fin 63f includes the outer wall surface 63g of the metal layer 63, the surface of the recess 73A, and the surface of the recess 73B. The recess 73B id an example of the second recess. In this embodiment, the recess 73A and the recess 73B are formed in a portion of the outer wall surface 63g. In other words, the recess 73A and the recess 73B are formed so that the outer wall surface 63g remains at a tip end of the fin 63f. However, the structure of the recesses 73A and 73B is not limited to the structure described above, and the recesses 73A and 73B may be formed so as to eliminate the outer wall surface 63g. For example, the tip end of the fin 63f may have a sharp shape.

In the two pipe walls 90, the metal layer 64 includes the upper surface 64a, the lower surface 64b, the inner wall surface 64s, the outer wall surface 64g, the recess 74A, and a recess 74B, at the end along the direction (for example, the +X-direction or the −X-direction) perpendicular to the direction in which the vapor Cv of the working fluid C flows. The recess 74A is formed to cave in from the upper surface 64a toward a portion closer to the upper surface 64a than a center portion along the thickness direction of the metal layer 64. The recess 74B is formed to cave in from the lower surface 64b toward a portion closer to the lower surface 64b than the center portion along the thickness direction of the metal layer 64. The surface of the recess 74B is provided to connect the lower surface 64b and an outer wall surface 64g of the metal layer 64. In other words, the recess 74B is formed in portions of the lower surface 64b and the outer wall surface 64g. The surface of recess 74B is sloped from the lower surface 64b to the outer wall surface 64g of metal layer 64. As illustrated in FIG. 14, the recess 74B is formed so as to extend along the direction (Y-direction) in which the vapor Cv of the working fluid C flows. The recess 74B is formed so that a space inside the recess 74B communicates to the outer portion of the vapor pipe 30. The recess 74A and the recess 74B may overlap in the plan view. The lower surface 64b of the metal layer 64 is in contact with the upper surface 65a of the metal layer 65, and a lower end of the recess 74B of the metal layer 64 is continuous with an upper end of the recess 75A of the metal layer 65. The recess 74B and recess 75A form a recess having a U-shaped cross section in the continuous outer wall surfaces 64g and 65g. A fin 64f is formed between the recess 74A and the recess 74B of metal layer 64. The fin 64f includes the outer wall surface 64g of the metal layer 64, the surface of the recess 74A, and the surface of the recess 74B. The recess 74B is an example of the second recess. In this embodiment, the recess 74A and the recess 74B are formed in a portion of the outer wall surface 64g. In other words, the recess 74A and the recess 74B are formed so that the outer wall surface 64g remains at a tip end of fin 64f. However, the structure of the recesses 74A and 74B is not limited to the structure described above, and the recesses 74A and 74B may be formed so as to eliminate the outer wall surface 64g. For example, the tip end of the fin 64f may have a sharp shape.

In the two pipe walls 90, the metal layer 65 includes the upper surface 65a, the lower surface 65b, the inner wall surface 65s, the outer wall surface 65g, the recess 75A, and a recess 75B, at the end along the direction (for example, the +X-direction or the −X-direction) perpendicular to the direction in which the vapor Cv of the working fluid C flows. The recess 75A is formed to cave in from the upper surface 65a toward a portion closer to the upper surface 65a than a center portion along the thickness direction of the metal layer 65. The recess 75B is formed to cave in from the lower surface 65b toward a portion closer to the lower surface 65b than the center portion along the thickness direction of the metal layer 65. The surface of the recess 75B is provided to connect the lower surface 65b and the outer wall surface 65g of the metal layer 65. In other words, the recess 75B is formed in portions of the lower surface 65b and the outer wall surface 65g. The surface of the recess 75B is sloped from the lower surface 65b to the outer wall surface 65g of the metal layer 65. As illustrated in FIG. 14, the recess 75B is famed so as to extend along the direction (Y-direction) in which the vapor Cv of the working fluid C flows. The recess 75B is formed so that a space inside the recesses 75B communicates to the outer portion of the vapor pipe 30. The recess 75A and the recess 75B may overlap in the plan view. The lower surface 65b of the metal layer 65 is in contact with the upper surface 66a of the metal layer 66, and a lower end of the recess 75B of the metal layer 65 is continuous with an upper end of the recess 76A of the metal layer 66. The recess 75B and recess 76A form a recess having a U-shaped cross section in the continuous outer wall surfaces 65g and 66g. A fin 65f is formed between the recess 75A and the recess 75B of metal layer 65. The fin 65f includes the outer wall surface 65g of the metal layer 65, the surface of the recess 75A, and the surface of the recess 75B. The recesses 75B are an example of a second recess. In this embodiment, the recess 75A and the recess 75B are formed in a portion of the outer wall surface 65g. In other words, the recess 75A and the recess 75B are formed so that the outer wall surface 65g remains at a tip end of the fin 65f. However, the structure of the recesses 75A and 75B is not limited to the structure described above, and the recesses 75A and 75B may be formed so as to eliminate the outer wall surface 65g. For example, the tip end of the fin 65f may have a sharp shape.

In the two pipe walls 90, the metal layer 66 includes the upper surface 66a, the lower surface 66b, the outer wall surface 66g, the recess 76A, and a recess 76B, at the end along the direction (for example, the +X-direction or the −X-direction) perpendicular to the direction in which the vapor Cv of the working fluid C flows. The recess 76A is formed to cave in from the upper surface 66a toward a portion closer to the upper surface 66a than a center portion along the thickness direction of the metal layer 66. The recess 76B is formed to cave in from the lower surface 66b to a portion closer to the lower surface 66b than the center portion along the thickness direction of the metal layer 66. The surface of the recess 76B is provided to connect the lower surface 66b and the outer wall surface 66g of the metal layer 66. In other words, the recess 76B is formed in portions of the lower surface 66b and the outer wall surface 66g. The surface of the recess 76B is sloped from the lower surface 66b to the outer wall surface 66g of the metal layer 66. As illustrated in FIG. 14, the recess 76B is formed so as to extend along the direction (Y-direction) in which the vapor Cv of the working fluid C flows. The recess 76B is formed so that a space inside the recess 76B communicates to the outer portion of the vapor pipe 30. The recess 76A and the recess 76B may overlap in the plan view. A fin 66f is formed between the recess 76A and the recess 76B of metal layer 66. The fin 66f includes the outer wall surface 66g of the metal layer 66, the surface of the recess 76A, and the surface of the recess 76B. The recess 76B is an example of the second recess. In this embodiment, the recess 76A and the recess 76B are formed in a portion of the outer wall surface 66g. In other words, the recess 76A and the recess 76B are formed so that the outer wall surface 66g remains at a tip end of fins 66f. However, the structure of the recesses 76A and 76B is not limited to the structure described above, and the recesses 76A and 76B may be formed so as to eliminate exterior wall surfaces 66g. For example, the tip end of the fin 66f may have a sharp shape.

The recesses 71B through 76B may also be formed in the metal layers 61 through 66 in the pipe walls of evaporator 10, the pipe walls of condenser 20, and the pipe walls of the liquid pipe 40.

Other parts of this embodiment have structures similar to those of the first embodiment.

The second embodiment can also improve the heat dissipation efficiency compared to conventional loop heat pipes.

Modification of Second Embodiment

A modification of the second embodiment mainly differs from the second embodiment in terms of the structure of the outermost metal layers. In this modification of the second embodiment, those parts that are the same as those of the second embodiment are designated by the same reference numerals, and a repeated description of the same parts may be omitted.

Figure 16:
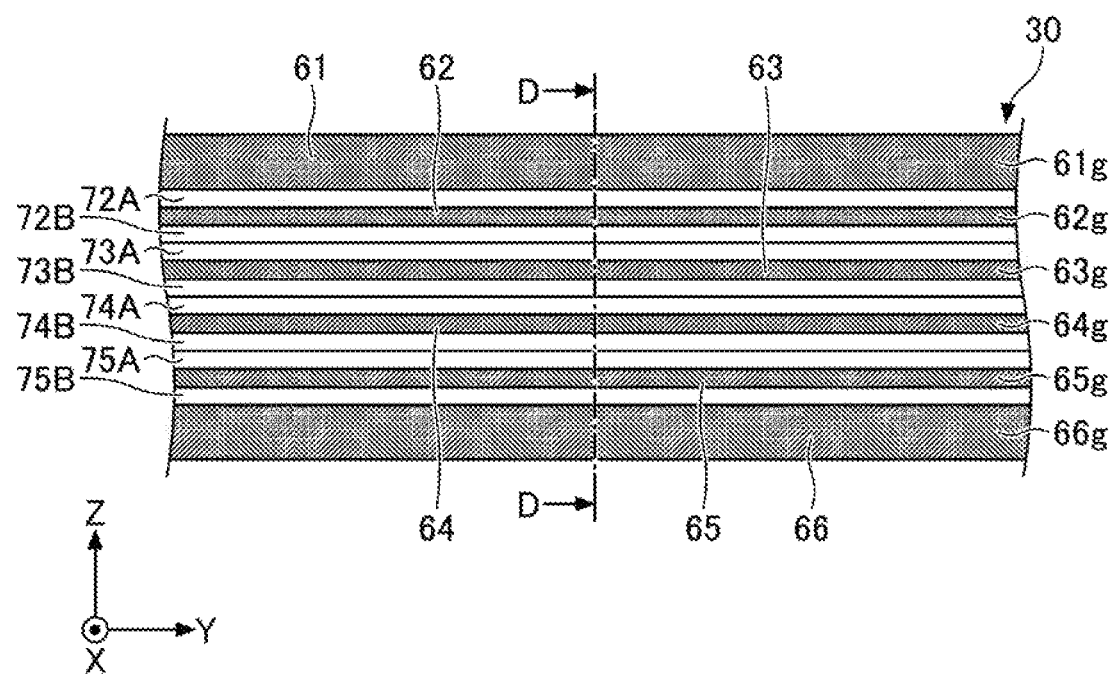
FIG. 16 is a side view illustrating an example of the vapor pipe according to a modification of the second embodiment.
Figure 17:
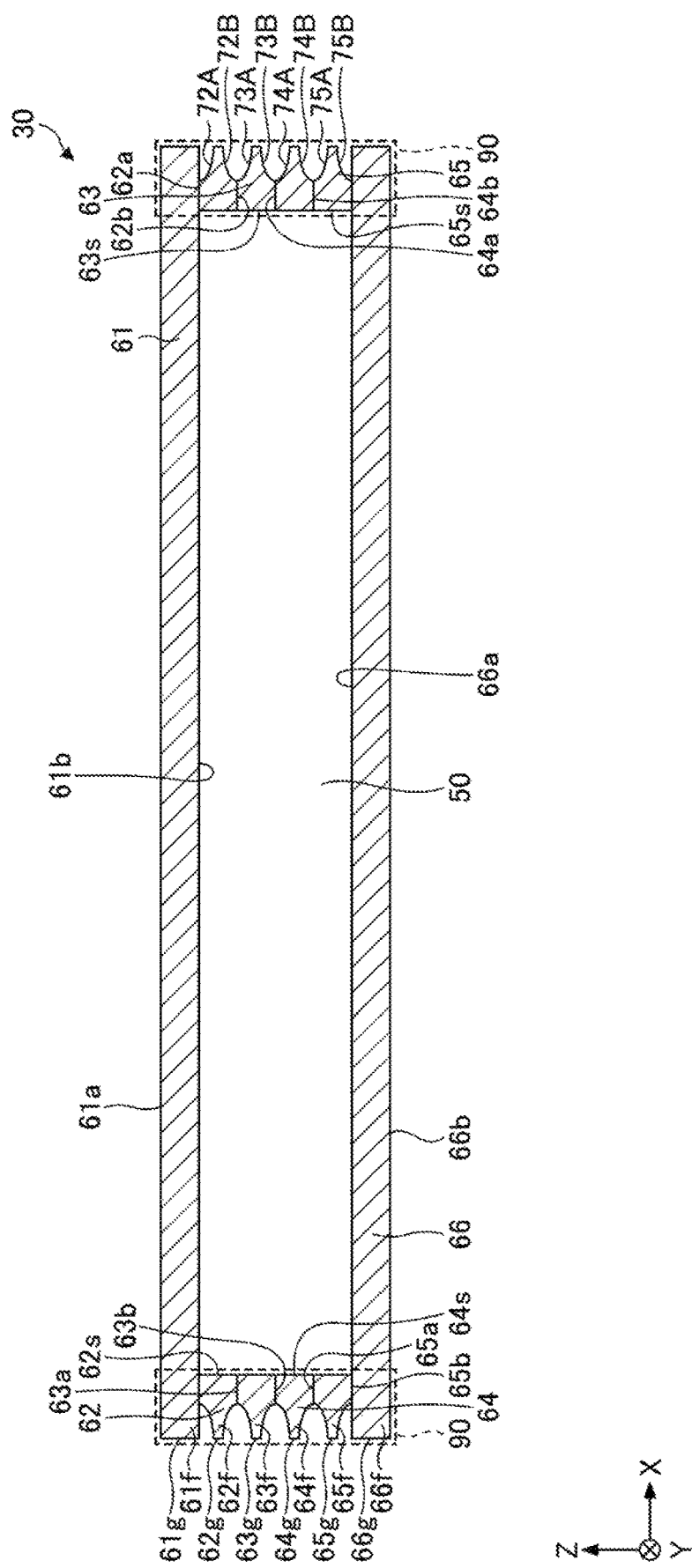
FIG. 17 is a cross sectional view illustrating the example of the vapor pipe according to the modification of the second embodiment.

FIG. 16 and FIG. 17 illustrate an example of the vapor pipe according to the modification of the second embodiment. FIG. 16 is a side view viewed from the X-direction, and FIG. 17 is a cross sectional view along the line D-D in FIG. 1 and FIG. 16.

In this modification of the second embodiment, the structures of the metal layers 62 through 65 are similar to those of the second embodiment. On the other hand, the recesses 71A and 71B are not formed in the first metal layer (one outermost metal layer) 61, and the recesses 76A and 76B are not formed in the sixth metal layer (the other outermost metal layer) 66, throughout the evaporator 10, the condenser 20, the vapor pipe 30, and the liquid pipe 40. In other words, the metal layers 61 and 66 are solid metal layers having no recess, no cavity, nor hole.

Other parts of this modification have structures similar to those of the second embodiment.

This modification of the second embodiment can also improve heat dissipation efficiency compared to conventional loop heat pipes. In addition, since the metal layers 61 and 66 are solid metal layers, excellent handling can easily be secured.

Third Embodiment

A third embodiment mainly differs from the first embodiment or the like, in terms of the structure of the recesses. In the third embodiment, those parts that are the same as those of the first and second embodiments are designated by the same reference numerals, and a repeated description of the same parts may be omitted.

Figure 18:
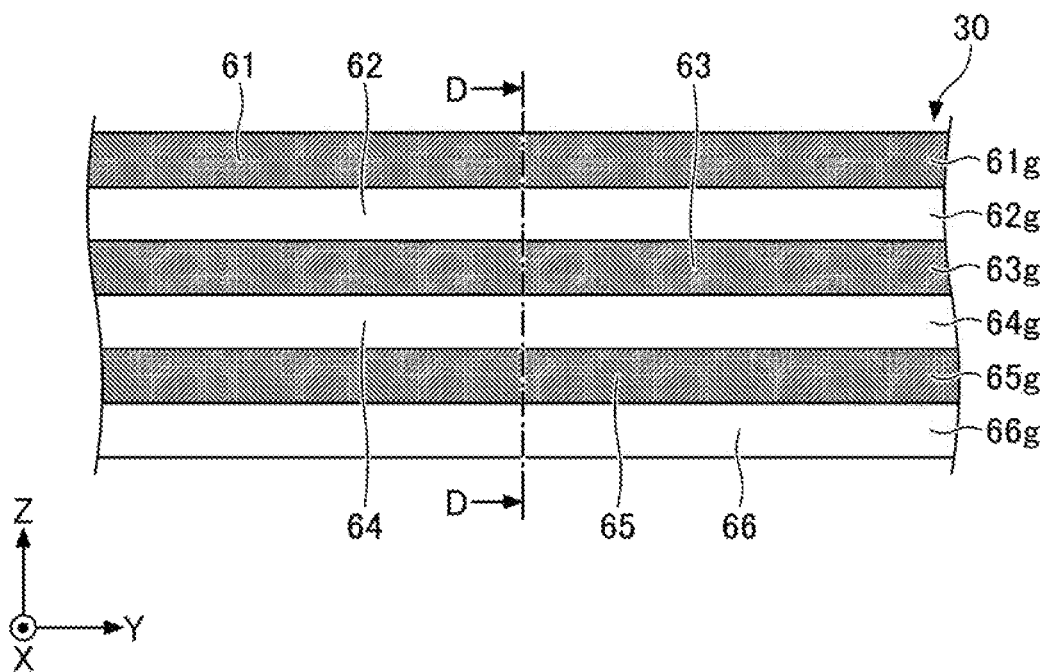
FIG. 18 is a side view illustrating an example of the vapor pipe according to a third embodiment.
Figure 19:
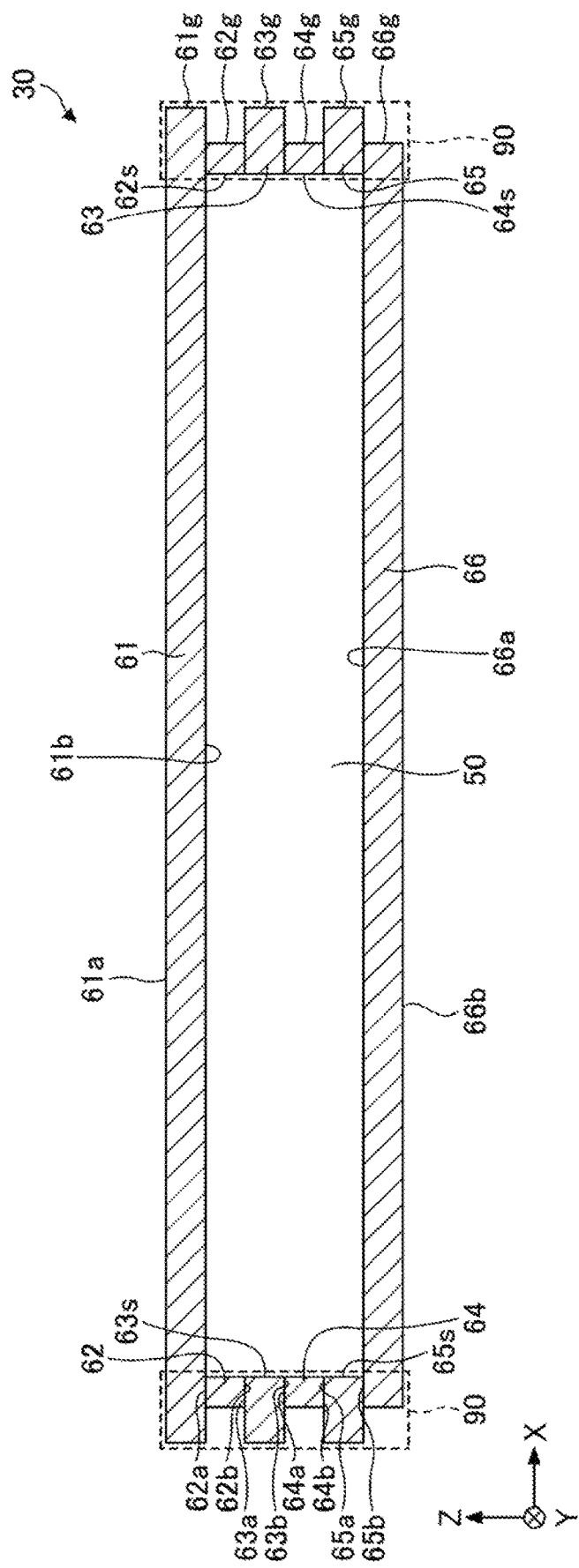
FIG. 19 is a cross sectional view illustrating the example of the vapor pipe according to the third embodiment.

FIG. 18 and FIG. 19 illustrate an example of the vapor pipe according to the third embodiment. FIG. 18 is a side view viewed from the X-direction, and FIG. 19 is a cross sectional view along the line D-D in FIG. 1 and FIG. 18.

In the third embodiment, no recesses are formed in the metal layers 61 through 66 in the pipe wall 90. In other words, the portions inside the pipe walls 90 of the metal layers 61 through 66 are solid metal layers.

In the plan view, in the direction (for example, the +X-direction or the −X-direction) perpendicular to the direction in which the vapor Cv of the working fluid C flows, the outer wall surface 62g of the metal layer 62, the outer wall surface 64g of the metal layer 64, and the outer wall surface 66g of the metal layer 66 are positioned closer to the passage 50 than the outer wall surface 61g of the metal layer 61, the outer wall surface 63g of the metal layer 63, and the outer wall surface 65g of the metal layer 65.

In the two pipe walls 90, the metal layer 61 includes the upper surface 61a, the lower surface 61b, and the outer wall surface 61g, at the end along the direction (for example, the +X-direction or the −X-direction) perpendicular to the direction in which the vapor Cv of the working fluid C flows. The upper surface 61a of the metal layer 61 is exposed to the outside. A portion of the lower surface 61b of the metal layer 61 is in contact with the upper surface 62a of the metal layer 62. A portion of the lower surface 61b of the metal layer 61, not in contact with the upper surface 62a of the metal layer 62, is exposed to the outside. The outer wall surface 61 of the metal layer 61 is exposed to the outside.

In the two pipe walls 90, the metal layer 62 includes the upper surface 62a, the lower surface 62b, the inner wall surface 62s, and the outer wall surface 62g, at the end along the direction (for example, the +X-direction or the −X-direction) perpendicular to the direction in which the vapor Cv of the working fluid C flows. The upper surface 62a of the metal layer 62 is in contact with the lower surface 61b of the metal layer 61. The lower surface 62b of the metal layer 62 is in contact with the upper surface 63a of the metal layer 63. The inner wall surface 62s of the metal layer 62 is exposed to the passage 50. The outer wall surface 62 of the metal layer 62 is exposed to the outside.

In the two pipe walls 90, the metal layer 63 includes the upper surface 63a, the lower surface 63b, the inner wall surface 63s, and the outer wall surface 63g, at the end along the direction (for example, the +X-direction or the −X-direction) perpendicular to the direction in which the vapor Cv of the working fluid C flows. A portion of the upper surface 63a of the metal layer 63 is in contact with the lower surface 62b of the metal layer 62. A portion of the upper surface 63a of the metal layer 63, not in contact with the lower surface 62b of the metal layer 62, is exposed to the outside. A portion of the lower surface 63b of the metal layer 63 is in contact with the upper surface 64a of the metal layer 64. A portion of the lower surface 63b of the metal layer 63, not in contact with the upper surface 64a of the metal layer 64, is exposed to the outside. The inner wall surface 63s of the metal layer 63 is exposed to the passage 50. The outer wall surface 63g of the metal layer 63 is exposed to the outside.

In the two pipe walls 90, the metal layer 64 includes the upper surface 64a, the lower surface 64b, the inner wall surface 64s, and the outer wall surface 64g, at the end along the direction (for example, the +X-direction or the −X-direction) perpendicular to the direction in which the vapor Cv of the working fluid C flows. The upper surface 64a of the metal layer 64 is in contact with the lower surface 63b of the metal layer 63. The lower surface 64b of the metal layer 64 is in contact with the upper surface 65a of the metal layer 65.

The inner wall surface 64s of the metal layer 64 is exposed to the passage 50. The outer wall surface 64g of the metal layer 64 is exposed to the outside.

In the two pipe walls 90, the metal layer 65 includes the upper surface 65a, the lower surface 65b, the inner wall surface 65s, and the outer wall surface 65g, at the end along the direction (for example, the +X-direction or the −X-direction) perpendicular to the direction in which the vapor Cv of the working fluid C flows. A portion of the upper surface 65a of the metal layer 65 is in contact with the lower surface 64b of the metal layer 64. A portion of the upper surface 65a of the metal layer 65, not in contact with the lower surface 64b of the metal layer 64, is exposed to the outside. A portion of the lower surface 65b of the metal layer 65 is in contact with the upper surface 66a of the metal layer 66. A portion of the lower surface 65b of the metal layer 65, not in contact with the upper surface 66a of the metal layer 66, is exposed to the outside. The inner wall surface 65s of the metal layer 65 is exposed to the passage 50. The outer wall surface 66 of the metal layer 66 is exposed to the outside.

In the two pipe walls 90, the metal layer 66 includes the upper surface 66a, the lower surface 66b, and the outer wall surface 66g, at the end along the direction (for example, the +X-direction or the −X-direction) perpendicular to the direction in which the vapor Cv of the working fluid C flows. The upper surface 66a of the metal layer 66 is in contact with the lower surface 65b of the metal layer 65. The lower surface 66b of the metal layer 66 is exposed to the outside. The outer wall surface 66 of the metal layer 66 is exposed to the outside.

In the third embodiment, the positions of the outer wall surfaces 61g, 63g, and 65g are aligned in the plan view, and the positions of the outer wall surfaces 62g, 64g, and 66g are aligned in the plan view. In addition, the outer wall surfaces 62g, 64g, and 66g are positioned closer to the passage 50 than the outer wall surfaces 61g, 63g, and 65g. Accordingly, the recesses are provided in the pipe walls 90 at portions of the metal layers 62, 64, and 66. Accordingly, in the third embodiment, the contact area of the pipe wall 90 with the ambient air is larger than the contact area with the ambient air for the case where the outer wall surfaces 61g through 66g coincide and the pipe wall 90 is flat. Hence, according to the third embodiment, the contact area with the ambient air is large, and the heat dissipation efficiency can be improved.

The positions of the outer wall surfaces 61g through 66g of the metal layers 61 through 66 may also be offset from one another in the plan view, for the pipe walls of the evaporator 10, the pipe walls of the condenser 20, and the pipe walls of the liquid pipe 40.

Other parts of this embodiment have structures similar to those of the first embodiment.

The third embodiment can also improve the heat dissipation efficiency compared to conventional loop heat pipes.

First Modification of Third Embodiment

A first modification of the third embodiment mainly differs from the third embodiment in terms of the structure of the recesses. In this first modification of the third embodiment, those parts that are the same as those of the third embodiment are designated by the same reference numerals, and a repeated description of the same parts may be omitted.

Figure 20:
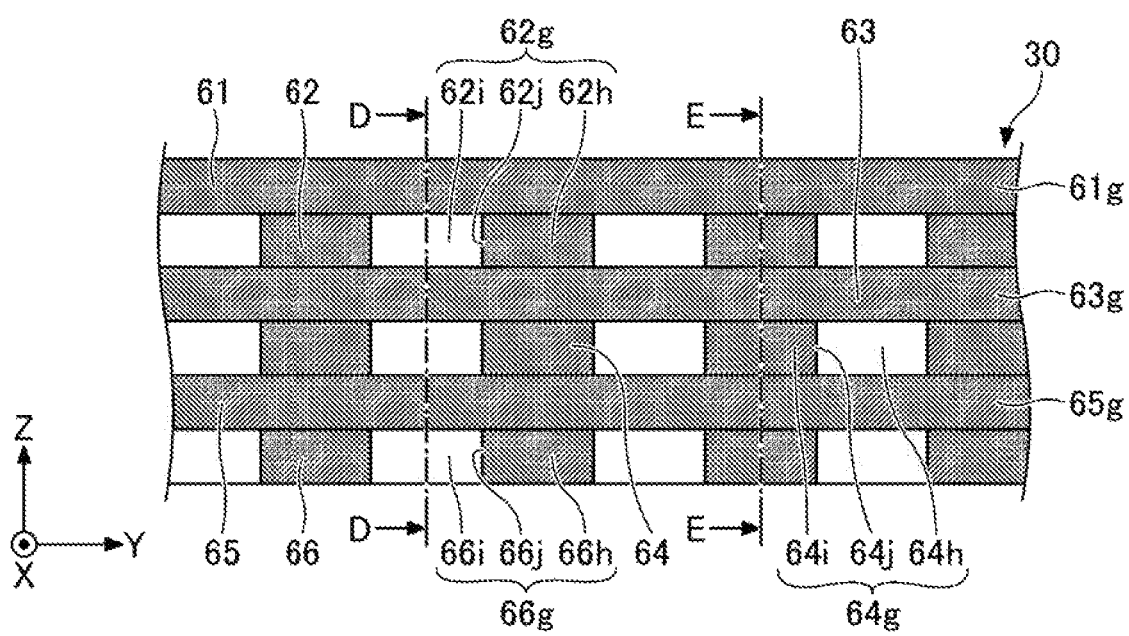
FIG. 20 is a side view illustrating an example of the vapor pipe according to a first modification of the third embodiment.
Figure 21:
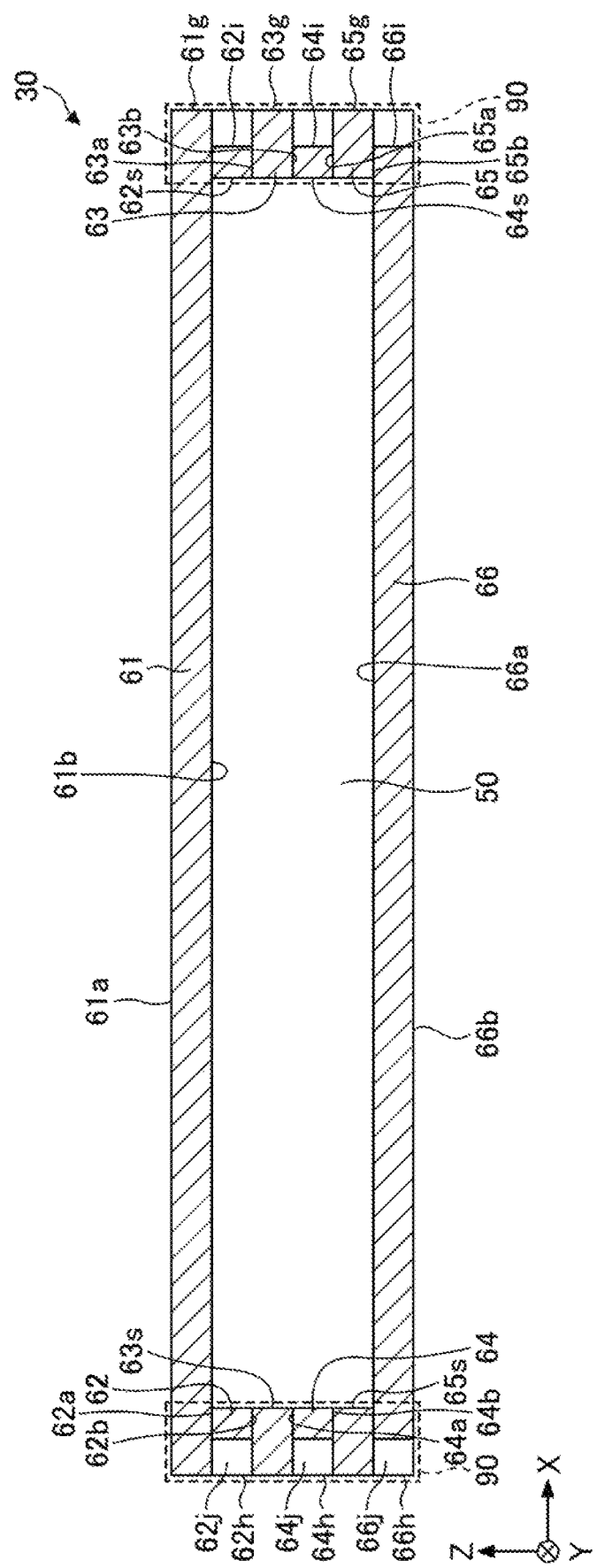
FIG. 21 is a cross sectional view (part 1) illustrating the example of the vapor pipe according to the first modification of the third embodiment.
Figure 22:
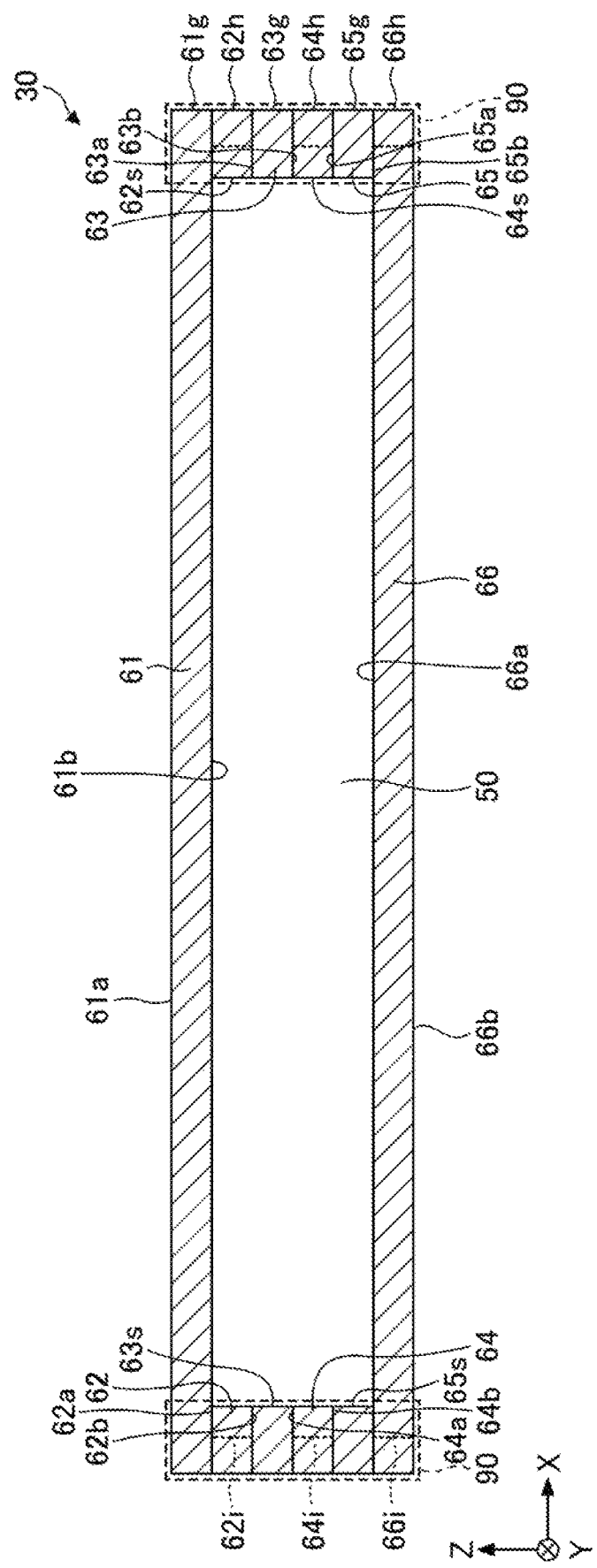
FIG. 22 is a cross sectional view (part 2) illustrating the example of the vapor pipe according to the first modification of the third embodiment.

FIG. 20 through FIG. 22 illustrate an example of the vapor pipe according to the first modification of the third embodiment. FIG. 20 is a side view viewed from the X-direction, FIG. 21 is a cross sectional view along the line D-D in FIG. 1 and FIG. 20, and FIG. 22 is a cross sectional view along a line E-E in FIG. 20.

In this first modification of the third embodiment, the outer wall surface 62g of the metal layer 62 is a concavo-convex surface. For example, the outer wall surface 62g includes a surface 62h, and a surface 61i. In the plan view, the surface 62h is aligned with the outer wall surface 61 of the metal layer 61, the outer wall surface 63g of the metal layer 63, and the outer wall surface 65g of the metal layer 65, while the surface 62i is positioned closer to the passage 50 than the outer wall surface 61g of the metal layer 61, the outer wall surface 63g of the metal layer 63, and the outer wall surface 65g of the metal layer 61. The outer wall surface 62g further includes a surface 62j that connects the surface 62h and the surface 62i. For example, the surface 62j is perpendicular to the surfaces 62h and 62i. A portion of the lower surface 61b of the metal layer 61, not in contact with the upper surface 62a of the metal layer 62, is exposed to the outside. A portion of the upper surface 63a of the metal layer 63, not in contact with the lower surface 62b of the metal layer 62, is exposed to the outside. The surface 62j, included in the outer wall surface 62g of metal layer 62, is exposed to the outside.

The outer wall surface 64g of the metal layer 64 is a concavo-convex surface. For example, the outer wall surface 64g includes a surface 64h, and a surface 64i. In the plan view, the surface 64h is aligned with the outer wall surface 61 of the metal layer 61, the outer wall surface 63g of the metal layer 63, and the outer wall surface 65g of the metal layer 65, while the surface 64i is positioned closer to the passage 50 than the outer wall surface 61g of the metal layer 61, the outer wall surface 63g of the metal layer 63, and the outer wall surface 65g of the metal layer 61. The outer wall surface 64g further includes a surface 64j that connects the surface 64h and the surface 64i. For example, the surface 64j is perpendicular to the surfaces 64h and 64i. A portion of the lower surface 63b of the metal layer 63, not in contact with the upper surface 64a of the metal layer 64, is exposed to the outside. The upper surface 65a of the metal layer 65, not in contact with the lower surface 64b of the metal layer 64, is exposed to the outside. The surface 64j, included in the outer wall surface 64g of metal layer 64, is exposed to the outside.

The outer wall surface 66g of the metal layer 66 is a concavo-convex surface. For example, the outer wall surface 66g includes a surface 66h, and a surface 66i. In the plan view, the surface 66h is aligned with the outer wall surface 61 of the metal layer 61, the outer wall surface 63g of the metal layer 63, and the outer wall surface 65g of the metal layer 65, while the surface 66i is positioned closer to the passage 50 than the outer wall surface 61g of the metal layer 61, the outer wall surface 63g of the metal layer 63, and the outer wall surface 65g of the metal layer 61. The outer wall surface 66g further includes a surface 66j that connects the surface 66h and the surface 66i. For example, the surface 66j is perpendicular to the surfaces 66h and 66i. A portion of the lower surface 65b of the metal layer 65, not in contact with the upper surface 66a of the metal layer 66, is exposed to the outside. The surface 66j, included in the outer wall surface 66g of metal layer 66, is exposed to the outside.

Other parts of this modification have structures similar to those of the third embodiment.

The first modification of the third embodiment can also improve heat dissipation efficiency compared to conventional loop heat pipes.

Second Modification of Third Embodiment

A second modification of the third embodiment mainly differs from the third embodiment in terms of the structure of the recesses. In this second modification of the third embodiment, those parts that are the same as those of the third embodiment are designated by the same reference numerals, and a repeated description of the same parts may be omitted.

Figure 23:
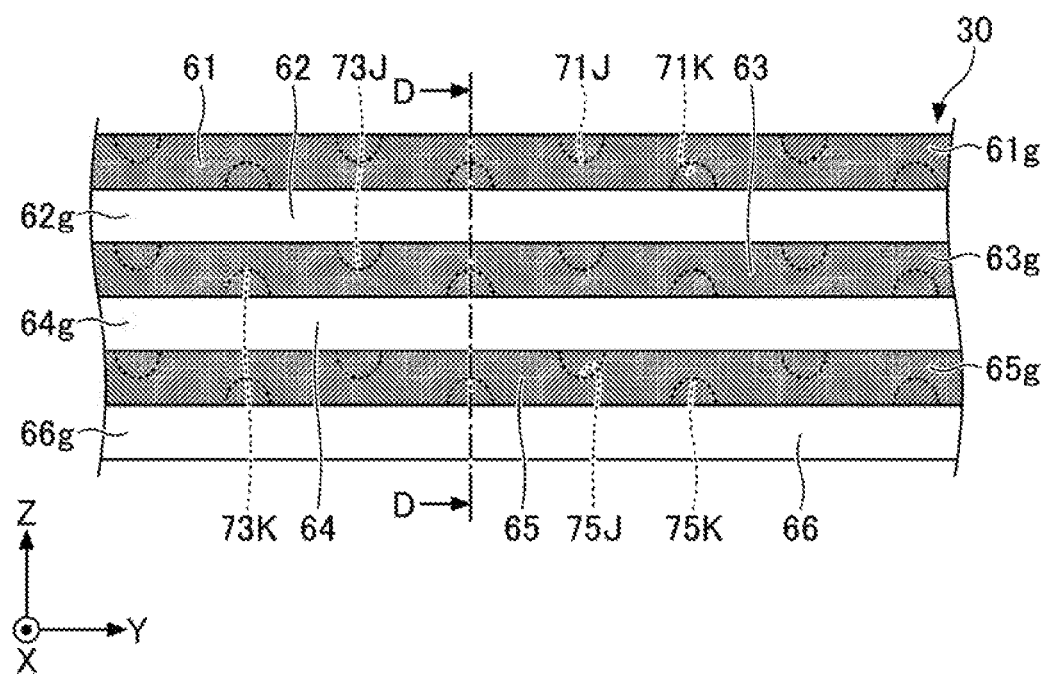
FIG. 23 is a side view illustrating an example of the vapor pipe according to a second modification of the third embodiment.
Figure 24:
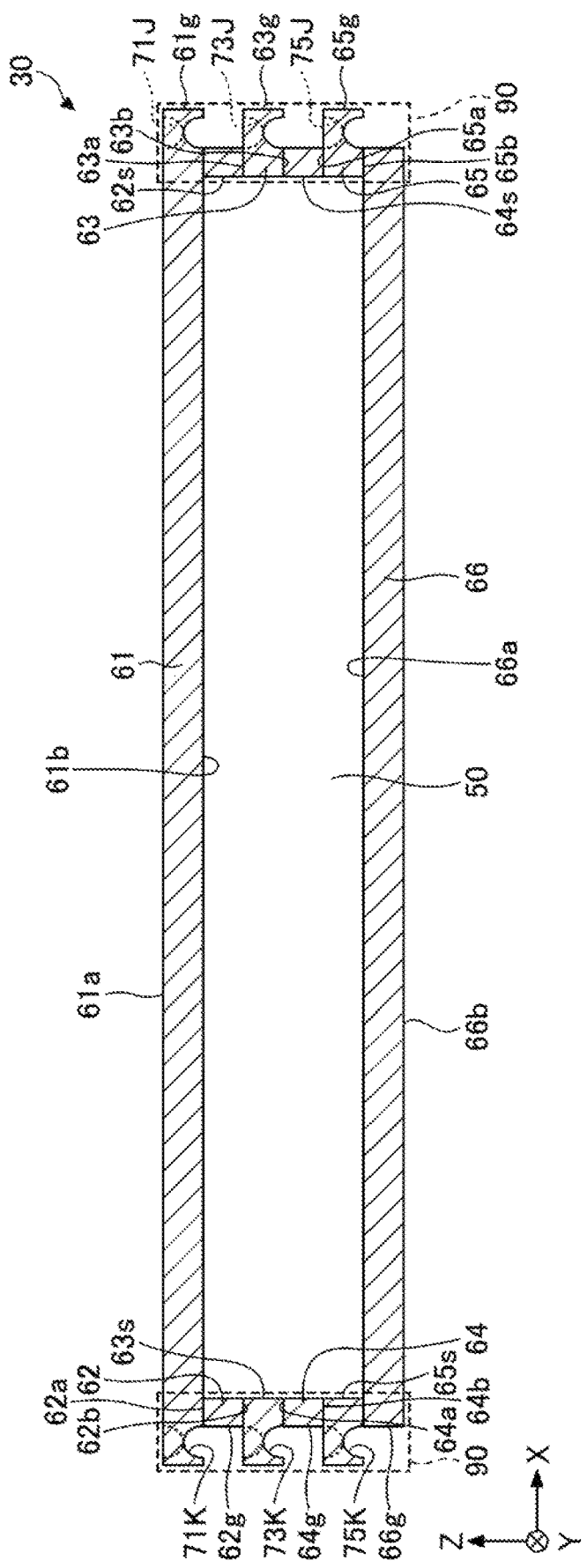
FIG. 24 is a cross sectional view illustrating the example of the vapor pipe according to the second modification of the third embodiment.

FIG. 23 and FIG. 24 are diagrams illustrating an example of the vapor pipe according to the second modification of the third embodiment. FIG. 23 is a side view viewed from the X-direction, and FIG. 24 is a cross sectional view along the line D-D in FIG. 1 and FIG. 23.

In the second modification of the third embodiment, in the plan view of the metal layer 61, a recess 71J that caves in from the upper surface 61a toward the approximate center portion along the thickness direction of the metal layer 61, and a recess 71K that caves in from the lower surface 61b toward the approximate center portion along the thickness direction of the metal layer 61, are formed at portions that protrude from the outer wall surface 62 of the metal layer 62, the outer wall surface 64g of the metal layer 64, and the outer wall surface 66g of the metal layer 66. The surface of recess 71J and the surface of recess 71K are exposed to the outside. For example, in the direction (for example, a +Y-direction or a −Y-direction) in which the vapor Cv of the working fluid C flows, the recess 71J and the recess 71K may be arranged alternately.

In the plan view of the metal layer 63, a recess 73J that caves in from the upper surface 63a toward the approximate center portion along the thickness direction of the metal layer 63, and a recess 73K that caves in from the lower surface 63b toward the approximate center portion along the thickness direction of the metal layer 63, are formed at portions that protrude from the outer wall surface 62g of the metal layer 62, the outer wall surface 64g of the metal layer 64, and the outer wall surface 66g of the metal layer 66. The surface of recess 73J and the surface of recess 73K are exposed to the outside. For example, in the direction (for example, the +Y-direction or the −Y-direction) in which the vapor Cv of the working fluid C flows, the recess 73J and the recess 73K may be arranged alternately.

In the plan view of the metal layer 65, a recess 75J that caves in from the upper surface 65a toward the approximate center portion along the thickness direction of the metal layer 65, and a recess 75K that caves in from the lower surface 65b toward the approximate center portion along the thickness direction of the metal layer 65, are formed at portions that protrude from the outer wall surface 62g of the metal layer 62, the outer wall surface 64g of the metal layer 64, and the outer wall surface 66g of the metal layer 66. The surface of recess 75J and the surface of recess 75K are exposed to the outside. For example, in the direction (for example, the +Y-direction or the −Y-direction) in which the vapor Cv of the working fluid C flows, the recess 75J and the recess 75K may be arranged alternately.

Other parts of this modification have structures similar to those of the third embodiment.

The second modification of the third embodiment can also improve the heat dissipation efficiency compared to conventional loop heat pipes.

The recesses may be formed in a portion of the outer wall surface of at least one of the evaporator 10, the condenser 20, the vapor pipe 30, and the liquid pipe 40, and need not be formed on all of the evaporator 10, the condenser 20, the vapor pipe 30, and the liquid pipe 40. For example, in a case where the recesses are formed in the evaporator 10, the condenser 20, and the vapor pipe 30, the recesses are formed continuously over the evaporator 10, the condenser 20, and the vapor pipe 30 so as to extend along the direction in which the working fluid flows. Moreover, in each of the embodiments, the recesses are formed in the two pipe walls, however, the recesses may be formed in at least one of the two pipe walls. The depths of the recesses need not be non-uniform, and recesses having different depths may be formed.

Figure 25:
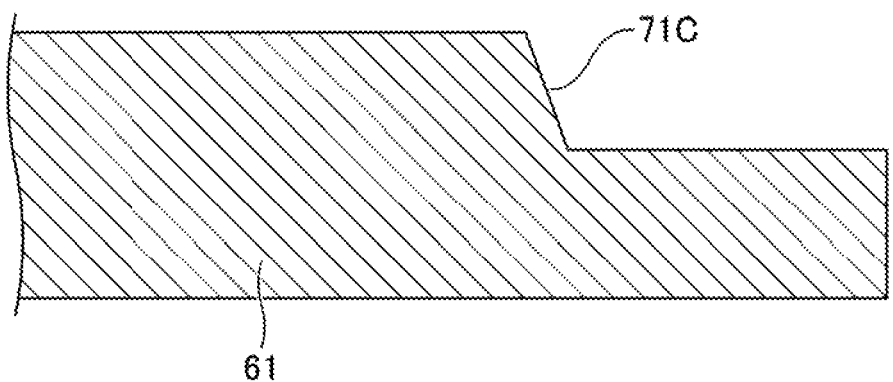
FIG. 25 is a cross sectional view illustrating an example of a shape of a recess.

In addition, the cross sectional shape of the recess is not limited to the semi-circular arcuate shape illustrated in FIG. 4 or the like. FIG. 25 is a cross sectional view illustrating an example of the shape of the recess. For example, a recess 71C having the shape illustrated in FIG. 25 may be formed in place of the recess 71A. The recess 71C includes a bottom surface, an inner wall surface, and an corner portion provided between the bottom surface and the inner wall surface. The inner wall may have a tapered shape that widens from the bottom surface toward the opening. The inner wall surface may be perpendicular to the bottom surface of the recess 71C. The same applies to other recesses, such as the recesses 72A through 76A or the like.

The position of the porous body 60 inside the liquid pipe 40 is not particularly limited. Preferably, however, the porous body 60 is provided at a position separated by a gap from the pipe wall of the liquid pipe 40. This gap enables a micro passage 50 through which the working fluid C flows, to be formed between the pipe wall and the porous body 60, thereby making it easier for the working fluid C to flow inside the liquid pipe 40.

With respect to the structure of the porous body 60, a bottomed hole may also be formed in the outermost layers of the porous body 60. For example, a plurality of bottomed holes, that cave in from the lower surface 61b to the approximate center portion along the thickness direction of the first metal layer 61, may be formed in the first metal layer 61. Further, a plurality of bottomed holes, that cave in from the upper surface 66a to the approximate center portion along the thickness direction of the sixth metal layer 66, may be formed in the sixth metal layer 66.

With respect to the structure of the porous body 60, pores may also be formed at the interface between the adjacent metal layers. For example, among the metal layers 62 through 65, the bottomed holes of the adjacent metal layers may partially overlap in the plan view to foil the pores.

Further, the pores forming the porous body 60 are not limited to the pores formed by partially communicating the bottomed holes formed from both sides (that is, the upper and lower surfaces) of each of the metal layers. For example, the pores forming the porous body 60 may include pores that are formed by laminating metal layers provided with through holes penetrating the respective metal layers along the thickness direction thereof, so that the through holes of the adjacent metal layers partially overlap in the plan view.

Accordingly to each of the embodiments and modifications described above, it is possible to improve the heat dissipation performance.

Various aspects of the subject-matter described herein may be set out non-exhaustively in the following numbered clauses:

1. A method for manufacturing a loop heat pipe, comprising:

forming an evaporator configured to vaporize a working fluid, a condenser configured to liquefy the working fluid, a liquid pipe configured to connect the evaporator and the condenser, and a vapor pipe configured to connect the evaporator and the condenser, and form a loop-shaped passage together with the liquid pipe, wherein the forming includes forming a recess in at least a portion of an outer wall surface of a pipe wall of the evaporator, the condenser, the liquid pipe, and the vapor pipe.

2. The method for manufacturing the loop heat pipe according to clause 1, wherein the forming includes
forming the evaporator, the condenser, the liquid pipe, and the vapor pipe by laminating a plurality of metal layers,
wherein the forming the recess includes half-etching a first metal layer among the plurality of metal layers, from a first principal surface of the first metal layer, to form a first recess in the first principal surface to be exposed to the outer wall surface.

3. The method for manufacturing the loop heat pipe according to clause 2, wherein the forming the recess includes half-etching the first metal layer from a second principal surface, on an opposite side from the first principal surface, to form a second recess in the second principal surface to be exposed to the outer wall surface.

4. The method for manufacturing the loop heat pipe according to clause 1, wherein the forming includes
forming the evaporator, the condenser, the liquid pipe, and the vapor pipe by laminating a plurality of metal layers; and
offsetting a position of the outer wall surface between metal layers among the plurality of laminated metal layers, adjacent to each other along a laminating direction in which the plurality of laminated metal layers are laminated.

Although the embodiments and modifications are numbered with, for example, "first," "second," or "third," the ordinal numbers do not imply priorities of the embodiments and modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A loop heat pipe comprising:
an evaporator configured to vaporizes a working fluid;
a condenser configured to liquefy the working fluid;
a liquid pipe configured to connect the evaporator and the condenser; and
a vapor pipe configured to connect the evaporator and the condenser, and forms a loop-shaped passage together with the liquid pipe, wherein
each of the evaporator, the condenser, the liquid pipe, and the vapor pipe includes a plurality of laminated metal layers forming a pair of pipe walls of the evaporator, the condenser, the liquid pipe, and the vapor pipe, respectively,
each of the pair of pipe walls has an outer wall surface formed by an outer side surface of each of the plurality of laminated metal layers, and
one of the plurality of laminated metal layers includes a recess, caving in from one of two opposite principal surfaces thereof toward an approximate center along a thickness direction thereof, at the outer wall surface of each of the pair of pipe walls.

2. The loop heat pipe as claimed in claim 1, wherein a first recess is formed in a first principal surface of a first metal layer among the plurality of laminated metal layers so as to be exposed at the outer wall surface.

3. The loop heat pipe as claimed in claim 2, wherein a surface of the first recess connects the first principal surface and the outer wall surface.

4. The loop heat pipe as claimed in claim 3, wherein the surface of the first recess slopes from the first principal surface toward the outer wall surface.

5. The loop heat pipe as claimed in claim 4, wherein a second recess is formed in a second principal surface of the first metal layer, on an opposite side from the first principal surface, so as to be exposed at the outer wall surface.

6. The loop heat pipe as claimed in claim 5, wherein a surface of the second recess connects the second principal surface and the outer wall surface.

7. The loop heat pipe as claimed in claim 6, wherein the surface of the second recess slopes from the second principal surface toward the outer wall surface.

8. The loop heat pipe as claimed in claim 7, wherein each of the first recess and the second recess extends along the passage.

9. The loop heat pipe as claimed in claim 7, wherein the second recess is continuous with the first recess of a second metal layer among the plurality laminated metal layers, adjacent to the first metal layer along a laminating direction in which the plurality of laminated metal layers is laminated.

10. The loop heat pipe of claim 7, wherein a position of the outer wall surface is offset between metal layers among the plurality of laminated metal layers, adjacent to each other along a laminating direction in which the plurality of laminated metal layers is laminated.

11. The loop heat pipe as claimed in claim 2, wherein a surface of the first recess slopes from the first principal surface toward the outer wall surface.

12. The loop heat pipe as claimed in claim 2, wherein the first recess extends along the passage.

13. The loop heat pipe as claimed in claim 2, wherein a second recess is formed in a second principal surface of the first metal layer, on an opposite side from the first principal surface, so as to be exposed at the outer wall surface.

14. The loop heat pipe as claimed in claim 13, wherein the surface of the second recess connects the second principal surface and the outer wall surface.

15. The loop heat pipe as claimed in claim 13, wherein a surface of the second recess slopes from the second principal surface toward the outer wall surface.

16. The loop heat pipe as claimed in claim 13, wherein the second recess extends along the passage.

17. The loop heat pipe as claimed in claim 13, wherein the second recess is continuous with the first recess of a second metal layer among the plurality laminated metal layers, adjacent to the first metal layer along a laminating direction in which the plurality of laminated metal layers is laminated.

18. The loop heat pipe of claim 1, wherein a position of the outer wall surface is offset between metal layers among the plurality of laminated metal layers, adjacent to each other along a laminating direction in which the plurality of laminated metal layers is laminated.

19. The loop heat pipe as claimed in claim 1, wherein the outer wall surface extends along a predetermined direction approximately perpendicular to a first principal surface of the loop heat pipe and a second principal surface of the loop heat pipe opposite to the first principal surface.

20. The loop heat pipe as claimed in claim 19, wherein the recess has a semi-circular arcuate shape in a cross section along a plane that is approximately perpendicular to each of the predetermined direction and the first and second principal surfaces of the loop heat pipe.

\* \* \* \* \*